United States Patent
Yamazaki et al.

(10) Patent No.: US 8,415,731 B2
(45) Date of Patent: Apr. 9, 2013

(54) SEMICONDUCTOR STORAGE DEVICE WITH INTEGRATED CAPACITOR AND HAVING TRANSISTOR OVERLAPPING SECTIONS

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 127 days.

(21) Appl. No.: 12/978,759

(22) Filed: Dec. 27, 2010

(65) Prior Publication Data

US 2011/0175087 A1   Jul. 21, 2011

(30) Foreign Application Priority Data

Jan. 20, 2010   (JP) ................................. 2010-010527

(51) Int. Cl.
*H01L 29/94*   (2006.01)
*H01L 27/108*   (2006.01)

(52) U.S. Cl. ......... 257/300; 257/E27.064; 257/E21.639; 438/199; 365/149

(58) Field of Classification Search .................. None
See application file for complete search history.

(56) References Cited

U.S. PATENT DOCUMENTS

| | | |
|---|---|---|
| 4,466,081 A | 8/1984 | Masuoka |
| 4,939,568 A * | 7/1990 | Kato et al. .................... 257/686 |
| 5,349,366 A | 9/1994 | Yamazaki et al. |
| 5,366,922 A | 11/1994 | Aoki et al. |
| 5,731,856 A | 3/1998 | Kim et al. |
| 5,744,864 A | 4/1998 | Cillessen et al. |
| 5,796,650 A | 8/1998 | Wik et al. |
| 5,851,866 A | 12/1998 | Son |
| 5,936,881 A | 8/1999 | Kawashima et al. |
| 6,127,702 A | 10/2000 | Yamazaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Marcos D. Pizarro
*Assistant Examiner* — César López
(74) *Attorney, Agent, or Firm* — Fish & Richardson P.C.

(57) ABSTRACT

To provide a storage device in which advantages of both a nonvolatile storage device and a volatile storage device can be obtained, a semiconductor device includes a first transistor provided in or over a substrate and a second transistor provided above the first transistor, where at least part of the first transistor and the second transistor are overlapped with each other, and a gate electrode of the first transistor and a source or drain electrode of the second transistor are electrically connected to each other. It is preferable that the first transistor be provided using single crystal silicon and the second transistor be provided using an oxide semiconductor having extremely low off-state current.

31 Claims, 16 Drawing Sheets

U.S. PATENT DOCUMENTS

| | | |
|---|---|---|
| 6,266,269 B1 | 7/2001 | Karp et al. |
| 6,294,274 B1 | 9/2001 | Kawazoe et al. |
| 6,515,511 B2 | 2/2003 | Sugibayashi et al. |
| 6,563,174 B2 | 5/2003 | Kawasaki et al. |
| 6,583,478 B2 * | 6/2003 | Hur ................................ 257/366 |
| 6,628,551 B2 | 9/2003 | Jain |
| 6,727,522 B1 | 4/2004 | Kawasaki et al. |
| 6,808,971 B2 | 10/2004 | Bhattacharyya |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,230,264 B2 * | 6/2007 | Thean et al. ..................... 257/19 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,235 B1 | 3/2008 | Yamazaki et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,483,013 B2 | 1/2009 | Osame |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 7,791,074 B2 | 9/2010 | Iwasaki |
| 7,935,582 B2 | 5/2011 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0249115 A1 * | 10/2007 | Luk et al. ...................... 438/238 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149984 A1 | 6/2008 | Chang et al. |
| 2008/0166834 A1 | 7/2008 | Kim et al. |
| 2008/0182358 A1 | 7/2008 | Cowdery-Corvan et al. |
| 2008/0185578 A1 | 8/2008 | Yoshizumi et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186437 A1 | 7/2009 | Akimoto |
| 2009/0186445 A1 | 7/2009 | Akimoto |
| 2009/0189153 A1 | 7/2009 | Iwasaki et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0203673 A1 | 8/2010 | Hayashi et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0089419 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0110145 A1 | 5/2011 | Yamazaki et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156027 A1 | 6/2011 | Yamazaki et al. |
| 2011/0156028 A1 | 6/2011 | Yamazaki et al. |
| 2011/0157961 A1 | 6/2011 | Yamazaki et al. |

FOREIGN PATENT DOCUMENTS

| | | | |
|---|---|---|---|
| JP | 47016085 Y1 | 8/1972 | |
| JP | 57-105889 A | 7/1982 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 63-268184 A | 11/1988 | |
| JP | 05-251705 A | 9/1993 | |
| JP | 08-264794 A | 10/1996 | |
| JP | 11-505377 A | 5/1999 | |
| JP | 11233789 A | 8/1999 | |
| JP | 2000-044236 A | 2/2000 | |

| | | | |
|---|---|---|---|
| JP | 2000-150900 A | 5/2000 | |
| JP | 2002-076356 A | 3/2002 | |
| JP | 2002-289859 A | 10/2002 | |
| JP | 2002-368226 A | 12/2002 | |
| JP | 2003-086000 A | 3/2003 | |
| JP | 2003-086808 A | 3/2003 | |
| JP | 2003101407 A | 4/2003 | |
| JP | 2004-103957 A | 4/2004 | |
| JP | 2004-273614 A | 9/2004 | |
| JP | 2004-273732 A | 9/2004 | |
| JP | 2007-103918 A | 4/2007 | |
| JP | 2008-211186 A | 9/2008 | |
| JP | 2009135350 A | 6/2009 | |
| JP | 2009-152633 A | 7/2009 | |
| WO | 2004/114391 A1 | 12/2004 | |
| WO | 2007/029844 A1 | 3/2007 | |
| WO | 2007/058329 A1 | 5/2007 | |
| WO | 2009-041713 A2 | 4/2009 | |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2011/050788, dated Apr. 19, 2011, 3 pages.

Written Opinion, PCT Application No. PCT/JP2011/050788, dated Apr. 19, 2011, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000 ° C.," Journal of Solid State Chemistry, 1985, vol. 60, pp. 382-384.

Kimizuka, N et al., "Syntheses and Single-Crystal Data of Homologous Compounds, In2O3(ZnO)m (m=3. 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13. 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZNO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Kim, M. et al., "High mobility bottom gate InGaZnO thin film transistors with SiOx etch stopper," Appl. Phys. Lett. (Applied Physics Letters), May 24, 2007, vol. 90, No. 21, pp. 212114-1-212114-3, in English.

* cited by examiner

FIG. 13A
FIG. 13C
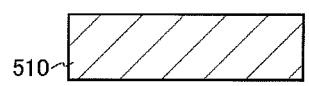
FIG. 13B
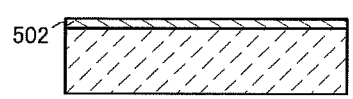
FIG. 13D
FIG. 13E
FIG. 13F
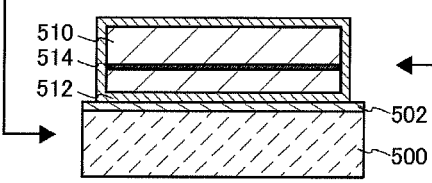
FIG. 13G  FIG. 13H
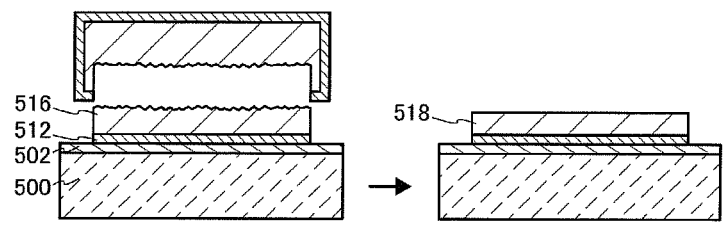

SEMICONDUCTOR STORAGE DEVICE WITH INTEGRATED CAPACITOR AND HAVING TRANSISTOR OVERLAPPING SECTIONS

TECHNICAL FIELD

An embodiment of the present invention relates to a semiconductor device and a manufacturing method thereof, in particular, a semiconductor device capable of storing data.

A semiconductor device refers to a device provided with at least one semiconductor element such as a transistor. Thus, a storage device is included in the semiconductor device. Note that the storage device refers to a device which includes a plurality of storage elements.

BACKGROUND ART

Storage devices using semiconductor elements are broadly classified into two categories: a volatile storage device that loses stored data when power supply stops, and a nonvolatile storage device that holds stored data even when power is not supplied.

Examples of a volatile storage device include a dynamic random access memory (hereinafter referred to as a DRAM) and a static random access memory (hereinafter referred to as an SRAM).

When a DRAM is formed using a conventional transistor, a data retention period is short because leakage current is generated between a source and a drain even when a transistor is off. For that reason, another writing operation (a refresh operation) is necessary at predetermined intervals, and this increases power consumption. In addition, when power supply stops, the above refresh operation cannot be performed; thus, data is lost.

On the other hand, although an SRAM retains stored data with the use of a circuit such as a flip-flop circuit and thus does not need refresh operation, unit price of the storage capacity is expensive. Note that when power supply stops, stored data is lost as in the case of the DRAM.

Typical examples of a nonvolatile storage device include a flash memory. A flash memory includes a floating gate between a gate electrode and a channel formation region in a transistor and retains data by injecting and retaining charge in the floating gate. Therefore, in a flash memory, the data retention period is long semi-permanently and refresh operation is not needed (e.g., Patent Document 1).

However, an insulating layer between the channel formation region and the floating gate deteriorates by tunneling current generated at the time of writing; therefore, there is a limitation on the number of writing operations. Therefore, for example, a method in which the number of writing operations into each storage element is equalized is employed by providing a complicated peripheral circuit. However, even when the method for equalizing the number of writing operations is employed, the fundamental problem of lifetime is not solved; therefore, it can be said that a flash memory is not suitable for usage where data is rewritten frequently.

Moreover, high voltages are needed to inject charge into the floating gate and removing charge from the floating gate; therefore, it is necessary to provide a step-up circuit or the like. Further, it takes a relatively long time to inject charge into the floating gate and remove charge from the floating gate; thus, it is difficult to perform a data writing operation and a data erasing operation at high speed.

REFERENCE

Patent Document

[Patent Document 1] Japanese Published Patent Application No. S57-105889

DISCLOSURE OF INVENTION

An object of an embodiment of the present invention is to provide a storage device or a semiconductor device where data can be retained even if power is not supplied, the number of data writing operations is not limited, and further the storage capacity per unit area is large, in a manner similar to that of a nonvolatile storage device.

An embodiment of the present invention is a semiconductor device including a storage circuit capable of retaining data in a capacitor even if power is not supplied in such a manner that a transistor with high operation speed and a transistor with low off-state current are combined. As the transistor with high operation speed, an insulated gate field-effect transistor including a silicon semiconductor can be applied as used in a number of integrated circuits. In contrast, as the transistor with low off-state current, an insulated gate field-effect transistor including a semiconductor whose band gap is wider than that of a silicon semiconductor, which is formed with an oxide semiconductor including, for example, metal oxide, can be applied. In the case where a storage circuit is formed with the use of these two kinds of transistor in combination, the storage circuit is unsuitable to increase the storage capacity per unit area when the two transistors are juxtaposed. Therefore, according to an embodiment of the present invention, the storage capacity per unit area is increased in such a manner that these two transistors are provided so that at least part thereof overlap with each other. Further, in order that the connection structure of the two transistors is simplified and also the two transistors can be arranged with high density, one of features of an embodiment of the present invention is that a gate electrode of one of the transistors and a drain electrode (or a source electrode) of the other of the transistors are in direct contact and are provided to overlap with each other.

Note that all of the transistors included in the storage circuit do not need to be provided with oxide semiconductors. It is preferable to provide a place where high-speed operation is required with a transistor including a semiconductor material other than an oxide semiconductor. Examples of such a semiconductor material include single crystal silicon.

One embodiment of the present invention is a semiconductor device comprising a first transistor and a second transistor. The first transistor includes a first channel formation region which includes a first semiconductor material, impurity regions provided with the first channel formation region interposed therebetween, a first gate insulating layer provided over the first channel formation region, a first gate electrode which at least overlaps with the first channel formation region and is provided over the first gate insulating layer, and a first source or drain electrode electrically connected to the impurity region. The second transistor includes second source and drain electrodes, a second channel formation region which includes a second semiconductor material and is electrically connected to the second source and drain electrodes, a second gate insulating layer provided over the second channel formation region, and a second gate electrode which at least overlaps with the second channel formation region and is provided over the second gate insulating layer. In the semiconductor device, the first transistor and the second transistor are provided so that at least part thereof overlap with each other, one of the second source and drain electrodes is electrically connected to the first gate electrode, and the other of the second source and drain electrodes is separated from the first gate electrode.

Another embodiment of the present invention is a semiconductor device comprising a first transistor, a second transistor, and a capacitor. The first transistor includes a first channel formation region which includes a first semiconductor material, impurity regions provided with the first channel formation region interposed therebetween, a first gate insulating layer provided over the first channel formation region, a first gate electrode which at least overlaps with the first channel formation region and is provided over the first gate insulating layer, and a first source or drain electrode electrically connected to the impurity region. The second transistor includes second source and drain electrodes, a second channel formation region which includes a second semiconductor material and is electrically connected to the second source and drain electrodes, a second gate insulating layer provided over the second channel formation region, and a second gate electrode which at least overlaps with the second channel formation region and is provided over the second gate insulating layer. The capacitor includes one of the second source and drain electrodes, the second gate insulating layer, and an electrode for the capacitor provided over the second gate insulating layer. In the semiconductor device, the first transistor and the second transistor are provided so that at least part thereof overlap with each other, one of the second source and drain electrodes is electrically connected to the first gate electrode, and the other of the second source a drain electrodes is separated from the first gate electrode.

Another embodiment of the present invention is a semiconductor device comprising a first transistor, a second transistor, and a capacitor. The first transistor includes a first channel formation region which includes a first semiconductor material, impurity regions provided with the first channel formation region interposed therebetween, a first gate insulating layer provided over the first channel formation region, a first gate electrode which at least overlaps with the first channel formation region and is provided over the first gate insulating layer, and a first source or drain electrode electrically connected to the impurity region. The second transistor includes second source and drain electrodes, a second channel formation region which includes a second semiconductor material and is electrically connected to the second source and drain electrodes, a second gate insulating layer provided over the second channel formation region, and a second gate electrode which at least overlaps with the second channel formation region and is provided over the second gate insulating layer. The capacitor includes one of the second source and drain electrodes, an oxide semiconductor layer partly including the second channel formation region, the second gate insulating layer, and an electrode for the capacitor provided over the second gate insulating layer. In the semiconductor device, the first transistor and the second transistor are provided so that at least part thereof overlap with each other, one of the second source and drain electrodes is electrically connected to the first gate electrode, and the other of the second source and drain electrodes is separated from the first gate electrode.

In the semiconductor device of the above structure, the first semiconductor material and the second semiconductor material are preferably different.

In the semiconductor device of the above structure, the second semiconductor material is preferably an oxide semiconductor.

In the semiconductor device of the above structure where the second semiconductor material is an oxide semiconductor, a plurality of insulating layers is preferably provided between the first transistor and the second transistor and at least an insulating layer of the plurality of insulating layers, which is in contact with the second transistor, is preferably formed with a sputtering method.

In the semiconductor device of the above structure, an energy gap of the second semiconductor material is preferably higher than 3 eV. For example, a wide band gap material typified by silicon carbide (more specifically, for example, a semiconductor material whose energy gap $E_g$ is higher than 3 eV) may be employed.

In the semiconductor device of the above structure, the first transistor is preferably capable of operating at higher speed than the second transistor.

In the semiconductor device of the above structure, an off-state current of the second transistor is preferably lower than an off-state current of the first transistor.

In the semiconductor device of the above structure, where the off-state current of the second transistor is lower than the off-state current of the first transistor, the off-state current of the second transistor at room temperature is preferably lower than or equal to 10 zA.

Note that in this specification, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the relation of components is reversed, unless otherwise specified.

In addition, in this specification, the term such as "electrode" or "wiring" does not limit a function of a component. For example, an "electrode" is sometimes used as part of a "wiring", and vice versa. Furthermore, the term such as "electrode" or wiring" can include the case where a plurality of "electrodes" or "wirings" is formed in an integrated manner.

Note that in this specification, a "film" refers to a film which is formed over the entire surface of an object with a CVD method (including a plasma CVD method and the like), a sputtering method, or the like. On the other hand, a "layer" refers to a layer which is formed by processing a film or a layer which is formed over the entire surface of an object and which does not need to be subjected to processing. However, a "film" and a "layer" are used without particular distinction.

Note that functions of the "source" or "drain" may be switched in the case where transistors of different polarities are employed or in the case where the direction of a current flow changes in a circuit operation, for example. Therefore, the terms such as "source" and "drain" can be used to denote the drain and the source, respectively, in this specification.

Note that in this specification, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

A storage device or a semiconductor device where data can be retained even if power is not supplied, the number of data writing operations is not limited, and further the storage capacity per unit area is large can be obtained in a manner similar to that of a nonvolatile storage device.

BRIEF DESCRIPTION OF DRAWINGS

FIGS. 13A to 13H illustrate a manufacturing method of a storage element according to an embodiment of the present invention.

BEST MODE FOR CARRYING OUT THE INVENTION

Figure 1A:
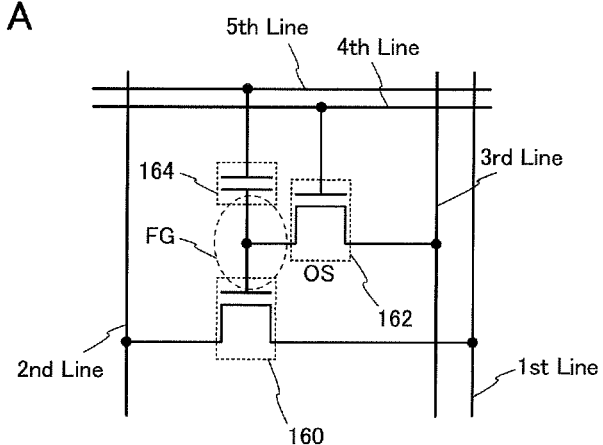
FIGS. 1A and 1B illustrate a storage element according to an embodiment of the present invention.

Examples of an embodiment of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the following description of the embodiments.

Note that the position, size, range, and the like of each component illustrated in the drawings which are referred in the following description are not actual ones in some cases to make them simple and make features stand out. Therefore, the present invention is not limited to the position, size, range, and the like disclosed in the drawings.

Note that in the following description, ordinal numbers such as "first", "second", and "third" are used for convenience in order to avoid confusion among components, and the terms do not limit the components numerically.

An example of a storage device according to an embodiment of the present invention will be described below.

Note that in each of circuit diagrams, in some cases, "OS" (abbreviation of an oxide semiconductor) is written besides a transistor in order to indicate that the transistor includes an oxide semiconductor.

FIG. 1A is a circuit diagram illustrating a configuration of a storage element according to an embodiment of the present invention. The storage element illustrated in FIG. 1A includes a transistor 160, a transistor 162, and a capacitor 164. In FIG. 1A, one of source and drain electrodes of the transistor 160 is electrically connected to a first wiring (also referred to as a $1^{st}$ Line), and the other of the source and drain electrodes of the transistor 160 is electrically connected to a second wiring (also referred to as a $2^{nd}$ Line). One of source and drain electrodes of the transistor 162 is electrically connected to a third wiring (also referred to as a $3^{rd}$ Line), and a gate electrode of the transistor 162 is electrically connected to a fourth wiring (also referred to as a $4^{th}$ Line). In addition, a gate electrode of the transistor 160 and the other of the source and drain electrodes of the transistor 162 are electrically connected to one of electrodes of the capacitor 164. The other of the electrodes of the capacitor 164 is electrically connected to a fifth line (also referred to as a $5^{th}$ Line).

A transistor including an oxide semiconductor is used as the transistor 162. The amount of off-state current of the transistor including an oxide semiconductor can be significantly reduced by high purification of the oxide semiconductor and removal of hydrogen and water. Therefore, charge supplied to the gate electrode of the transistor 160 can be retained for an extremely long time by turning off the transistor 162. Provision of the capacitor 164 facilitates retaining of charge supplied to the gate electrode of the transistor 160 and also reading of retained data. Note that the channel length of the transistor 162 is preferably 10 nm to 1000 nm inclusive. The channel length is set to 10 nm and 1000 nm inclusive, so that high-speed operation can be performed and power consumption can be reduced.

The data writing operation, data retaining operation, and data reading operation in the storage element illustrated in FIG. 1A will be described below.

First, the charge supplied from the third wiring is supplied to the gate electrode of the transistor 160 and one of the electrodes of the capacitor 164 by turning on the transistor 162 by the fourth wiring. In other words, the charge is supplied to a portion FG of FIG. 1A (the writing operation). Here, any of charges giving two different potential levels (hereinafter referred to as a "low-level charge" and a "high-level charge") is supplied.

After that, the charge in the portion FG of FIG. 1A is retained by turning off the transistor 162 by the fourth wiring (the retaining operation).

The off-state current of the transistor 162 is extremely low; thus, the charge in the portion FG is retained for a long time.

Next, the data reading operation will be described. When an appropriate potential (a reading potential) is supplied to the fifth wiring while a predetermined potential (a constant potential) is supplied to the first wiring, the potential of the second wiring varies depending on the amount of charge retained in the portion FG (the potential of the gate electrode of the transistor 160). This is because in general, when the transistor 160 is an n-channel transistor, an "apparent threshold voltage" $V_{th\_H}$ in the case where a high-level charge is supplied to the gate electrode of the transistor 160 is lower than an "apparent threshold voltage" $V_{th\_L}$ in the case where a low-level charge is supplied to the gate electrode of the transistor 160. Here, an "apparent threshold voltage" of the transistor 160 refers to the potential of the fifth wiring, which is needed to turn on the transistor 160 when the potential of the first wiring is set to a constant potential. Thus, the potential of the fifth wiring is set to a potential $V_0$ intermediate between $V_{th\_H}$ and $V_{th\_L}$, whereby the charge supplied to the gate electrode of the transistor 160 can be determined whether it is a high-level charge or a low-level charge. For example, in the case where high-level charge is retained, when the potential of the fifth wiring is set to $V_0$ ($>V_{th\_H}$), the transistor 160 is turned on. In the case where low level charge is retained, even when the potential of the fifth wiring is set to $V_0$ ($<V_{th\_L}$), the transistor 160 remains in off. Therefore, the retained data can be determined and read by referring to the potential of the second wiring.

Note that in the case where storage elements are arrayed to be used, only data of the desired storage element is needed to be read. In the case where data is read in this manner, a potential at which the transistor 160 is turned off regardless of the state of the gate electrode (a potential lower than $V_{th\_H}$) may be supplied to the fifth wiring. Alternatively, a potential at which the transistor 160 is turned on regardless of the state of the gate electrode (a potential higher than $V_{th\_L}$) may be supplied to the fifth wiring.

Next, a data rewriting operation will be described. The data rewriting operation is performed in a manner similar to that of the above data writing operation and data retaining operation. That is, the transistor 162 is turned on by the potential of the fourth wiring. Accordingly, the potential of the third wiring (a potential related to new data) is supplied to the portion FG. After that, charge of the potential related to new data is supplied to the portion FG by turning off the transistor 162 by the potential of the fourth wiring.

In the storage element according to an embodiment of the present invention, data can be directly rewritten by another writing of data as described above. Therefore, a high voltage which has been needed at the time of extracting charge from a floating gate in a flash memory or the like is not necessary; thus, a reduction in operation speed due to injection of charge into the floating gate and removal of charge from the floating gate can be suppressed.

Note that the other of the source and drain electrodes of the transistor 162 is electrically connected to the gate electrode of the transistor 160, whereby the portion FG in FIG. 1A has a function similar to a floating gate of a flash memory. In the case where the transistor 162 is off, the portion FG can be regarded as being embedded in an insulator; thus, charge is retained in the portion FG. The amount of off-state current of the transistor 162 which is provided for the storage element according to an embodiment of the present invention can be lower than or equal to one hundred thousandth of the amount of off-state current of a conventional transistor including silicon or the like. Therefore, the storage element according to an embodiment of the present invention can be regarded as a storage element where leakage of charge from the portion FG through the transistor 162 seldom occurs. That is, with the storage element according to an embodiment of the present invention, a nonvolatile storage device where data can be retained even if power is not supplied can be realized.

For example, in the case where the off-state current of the transistor 162 is lower than or equal to 10 zA at room temperature and the capacitance value of the capacitor 164 is approximately 10 fF, data can be retained for at least $10^4$ seconds. Note that the retention period varies depending on characteristics of the transistor and the capacitance value of the capacitor.

Further, as described above, in the storage element according to an embodiment of the present invention, which differs from a flash memory, tunneling current that deteriorates an insulating layer between a channel formation region and a floating gate is not used. Therefore, there is no limitation on the number of writing operations. Furthermore, a high voltage which has been needed at the time of writing or erasing in the conventional floating gate transistor is not necessary.

Figure 1B:
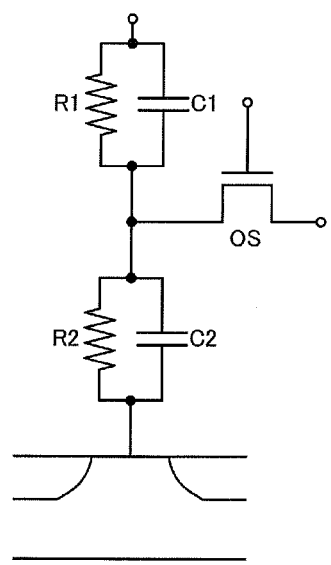

The components such as the transistors in the storage element illustrated in FIG. 1A can be regarded as being formed with a resistor and a capacitor as illustrated in FIG. 1B. As illustrated in FIG. 1B, in each of the transistor 160 and the capacitor 164, a resistor and a capacitor can be regarded as being connected to each other in parallel. R1 and C1 denote the resistance value and the capacitance value of the capacitor 164, respectively. The resistance value R1 corresponds to the resistance value which depends on an insulating layer included in the capacitor 164. R2 and C2 denote the resistance value and the capacitance value of the transistor 160, respectively. The resistance value R2 corresponds to the resistance value which depends on a gate insulating layer at the time when the transistor 160 is on. The capacitance value C2 corresponds to the capacitance value of a so-called gate capacitor (a capacitor formed between a gate electrode, and a source or drain electrode; and a capacitor formed between a gate electrode and a channel formation region).

A charge retention period (also referred to as a data retention period) is determined mainly by off-state current of the transistor 162 under the conditions that gate leakage current of the transistor 162 is sufficiently low and that, when the resistance value (also referred to as effective resistance) between the source and drain electrodes when the transistor 162 is off is ROS, R1 is larger than ROS and R2 is smaller than ROS.

On the other hand, in the case where the conditions are not satisfied, it is difficult to secure the retention period sufficiently even if the off-state current of the transistor 162 is sufficiently low. This is because leakage current other than the off-state current of the transistor 162 (e.g., leakage current generated between the source and gate electrodes) is high. Accordingly, it is preferable that the storage element according to an embodiment of the present invention satisfy the above relation.

On the other hand, C1 is preferably greater than or equal to C2. If C1 is large, variation in potential of the fifth wiring can be suppressed when the potential of the portion FG is controlled by the fifth wiring (e.g., at the time of reading).

Note that R1 and R2 are determined by the gate insulating layer of the transistor 160 and a gate insulating layer of the transistor 162. The same relation is applied to C1 and C2. Therefore, the materials, the thicknesses, and the like of the gate insulating layers are set as appropriate, so that a storage element satisfying the above relation can be realized.

In the storage element according to an embodiment of the present invention, the portion FG has a function similar to a floating gate of a floating gate transistor of a flash memory or the like, but the portion FG has a feature which is essentially different from that of the floating gate of the flash memory or the like. In the conventional flash memory, a tunneling current is generated by application of a high electric field to a control gate; therefore, it is necessary to keep a proper distance between storage elements in order to prevent the electric field from affecting the floating gate of the adjacent cell. Accordingly, integration of the storage device is inhibited.

Further, because of the above principle of the flash memory, deterioration of an insulating layer proceeds and thus there is a limitation on the number of rewriting operations.

The storage element according to an embodiment of the present invention operates by switching of a transistor, and charge injection by tunneling current does not occur unlike the conventional flash memory. That is, a high electric field for charge injection is not necessary unlike a flash memory. Accordingly, it is not necessary to consider an influence of a high electric field from a control gate on an adjacent cell, which facilitates higher integration than the case of the conventional flash memory.

Further, as will be described later, the transistor 160 and the transistor 162 are provided to overlap with each other, so that higher integration is also possible.

Furthermore, in the conventional floating gate transistor, charge travels in a gate insulating film (a tunnel insulating film) during a writing operation, whereby deterioration of the gate insulating film (tunnel insulating film) cannot be avoided. In contrast, in the storage element according to an embodiment of the present invention, data is written by a switching operation of a writing transistor; therefore, the deterioration of a gate insulating film, which has been recognized as a problem of the conventional floating gate transistor, can be solved. This means that there is no limitation on the number of writing operations in principle and writing durability is extremely high. For example, in the storage element according to an embodiment of the present invention, data can also be written $1\times10^9$ or more times (one billion or more times).

Further, since charge injection by tunneling current is not utilized, there is no cause for deterioration of a storage element. In other words, the storage element according to an embodiment of the present invention has higher durability and reliability than a flash memory.

Moreover, since a high electric field is unnecessary, a step-up circuit is unnecessary at least for the storage element. Therefore, a large-sized peripheral circuit is not necessary, and the frame of a storage device can be narrowed.

In the case where the dielectric constant $\epsilon r1$ of the insulating layer included in C1 is different from the dielectric constant $\epsilon r2$ of the insulating layer included in C2, it is preferable that an area S1 of C1 be twice or less an area S2 of C2 (more preferably, the area S1 is smaller than or equal to the area S2) and that C2 be smaller than C1. Specifically, for example, as materials of the insulating layers, a stack of a layer formed with a high-k material such as hafnium oxide and a layer formed with an oxide semiconductor may be used for C1 so that $\epsilon r1$ is set to 10 or more (preferably, 15 or more), and a silicon oxide layer may be used for C2 so that $\epsilon r2$ is set to 3 to 4. Combination of such structures enables higher integration of the storage element according to an embodiment of the present invention.

Note that although an n-channel transistor in which electrons are majority carriers is used in the above description, a p-channel transistor in which holes are majority carriers can also be used instead of the n-channel transistor.

As described above, the storage element according to an embodiment of the present invention includes a nonvolatile storage element including a writing transistor where leakage current (off-state current) between a source and a drain is low in an off state; a reading transistor formed using a semiconductor material which is different from that of the writing transistor; and a capacitor.

The off-state current of the writing transistor is 100 zA or lower, preferably 10 zA or lower, or more preferably 1 zA or lower at a temperature in use (e.g., 25° C.). In the case of a transistor including silicon, it is difficult to achieve low off-state current as described above. However, with a transistor including an oxide semiconductor, low off-state current can be achieved. Therefore, a transistor including an oxide semiconductor is preferably used as the writing transistor.

Further, a transistor including an oxide semiconductor has a small subthreshold swing (S value), so that the switching rate can be sufficiently increased even if mobility is comparatively low. Therefore, with the use of the transistor as the writing transistor, rising of a writing pulse supplied to the portion FG can be extremely sharp.

Note that since the off-state current of the writing transistor is low, the amount of charge retained in the portion FG can be reduced. Further, the data writing operation and the data erasing operation can be performed at high speed; therefore, rewriting of data can be performed at high speed.

As for the reading transistor, it is preferable to use a transistor which operates at high speed in order to increase the reading rate. For example, a transistor with a switching rate of 1 nano second or lower is preferably used as the reading transistor.

Data is written in such a manner that the writing transistor is turned on so that a voltage is applied to the portion FG, where the other of the source and drain electrodes of the writing transistor, one of the electrodes of the capacitor, and the gate electrode of the reading transistor are electrically connected to each other, and then the writing transistor is turned off so that the predetermined amount of charge is retained in the portion FG. Here, since the off-state current of the writing transistor is extremely low, the charge supplied to the portion FG is retained for a long time. When the off-state current is, for example, substantially 0, a refresh operation is not needed or, even in the case where a refresh operation is performed, the frequency of the refresh operation can be extremely low (for example, about once a month or a year). Accordingly, power consumption of a storage element can be reduced sufficiently.

Note that in the storage element according to an embodiment of the present invention, data can be directly rewritten by another writing of data into the storage element. Therefore, an erasing operation which is necessary for a flash memory or the like is not needed, so that a reduction in operation speed due to the erasing operation can be prevented.

Note that the highest voltage applied to the storage element according to an embodiment of the present invention (the difference between the highest potential and the lowest potential applied to respective terminals of the storage element at the same time) can be 5 V or lower, preferably 3 V or lower in each storage element in the case where data of two stages (one bit) is written.

The storage element according to an embodiment of the present invention may include at least a writing transistor, a reading transistor, and a capacitor, and the storage element can operate even when the area of the capacitor is small. Therefore, the storage capacity per unit area can be increased as compared to, for example, an SRAM which requires six transistors in each storage element.

Further, in the oxide semiconductor used for the storage element according to an embodiment of the present invention, the current-voltage characteristics of the storage element is not degraded even at, for example, a high temperature of 150° C. because the oxide semiconductor has a high energy gap of 3.0 eV to 3.5 eV and extremely few thermally excited carriers. In the transistor used for the storage element according to an embodiment of the present invention, there is no characteristic deterioration even at a high temperature of 150° C. and the off-state current is as extremely low as 100 zA or lower.

Figure 2:
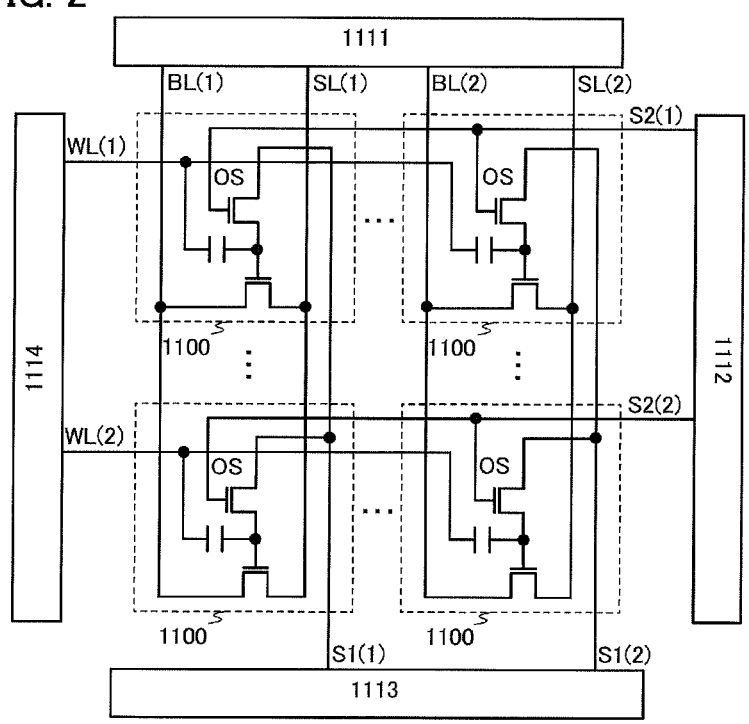
FIG. 2 illustrates a storage device according to an embodiment of the present invention.

FIG. 2 illustrates a configuration of a storage device in which the storage elements described with reference to FIGS. 1A and 1B are arranged in matrix as a storage device according to an embodiment of the present invention. Note that although, in FIG. 2, the storage elements are arranged in matrix of 2 storage elements in vertical (rows) by 2 storage elements in horizontal (columns) for simple description, a storage device in which the storage elements are arranged in a matrix of m storage elements in vertical (rows) by n storage elements in horizontal (columns) (both m and n are natural numbers) will be described below.

In the storage device illustrated in FIG. 2, a plurality of storage elements 1100 is arranged in matrix of m storage elements in vertical (rows) by n storage elements in horizontal (columns) (both m and n are natural number); a first driver circuit 1111, a second driver circuit 1112, a third driver circuit 1113, and a fourth driver circuit 1114 are arranged on outer sides thereof; and these driver circuits and storage elements 1100 are connected by m word lines WL, m second signal lines S2, n bit lines BL, n source lines SL, and n first signal lines S1. Here, the storage element illustrated in FIG. 1A is used for the storage element 1100.

In the storage element 1100, a first transistor, a second transistor, and a capacitor correspond to the transistor 160, the transistor 162, and the capacitor 164, respectively, which are illustrated in FIG. 1A. In addition, the source line SL, the bit line BL, the first signal line S1, the second signal line S2, and the word line WL correspond to the first wiring, the second wiring, the third wiring, the fourth wiring, and the fifth wiring, respectively, which are illustrated in FIG. 1A.

In other words, in the storage element 1100, one of source and drain electrodes of the first transistor is electrically connected to the source line SL, and the other of the source and drain electrodes of the first transistor is electrically connected to the bit line BL. One of source and drain electrodes of the second transistor is electrically connected to the first signal line S1, and a gate electrode of the second transistor is electrically connected to the second signal line S2. In addition, a gate electrode of the first transistor and the other of the source and drain electrodes of the second transistor are electrically connected to one of electrodes of the capacitor. The other of the electrodes of the capacitor is electrically connected to the word line WL.

Further, the storage elements 1100 are connected in parallel between the source line SL and the bit line BL. For example, the storage element 1100 of an i-th row and a j-column (i,j) (i is an integer which is 1 to m inclusive, and j is an integer which is 1 to n inclusive) is connected to the source line SL(j), the bit line BL(j), the first signal line S1(j), the word line WL(i), and the second signal line S2(i).

The source lines SL and the bit lines BL are connected to the first driver circuit 1111. The first signal lines S1 are connected to the third driver circuit 1113. The second signal lines S2 are connected to the second driver circuit 1112. The word lines WL are connected to the fourth driver circuit 1114. Note that here, the first driver circuit 1111, the second driver circuit 1112, the third driver circuit 1113, and the fourth driver circuit 1114 are separately provided; however, without limitation thereto, a decoder having a function of one or a plurality of these driver circuits may be used.

Next, a writing operation and a reading operation of the storage device illustrated in FIG. 2 will be described with reference to a timing chart illustrated in FIG. 3.

Although the operation of the storage device of two rows by two columns will be described for simplification, the present invention is not limited thereto.

Figure 3:
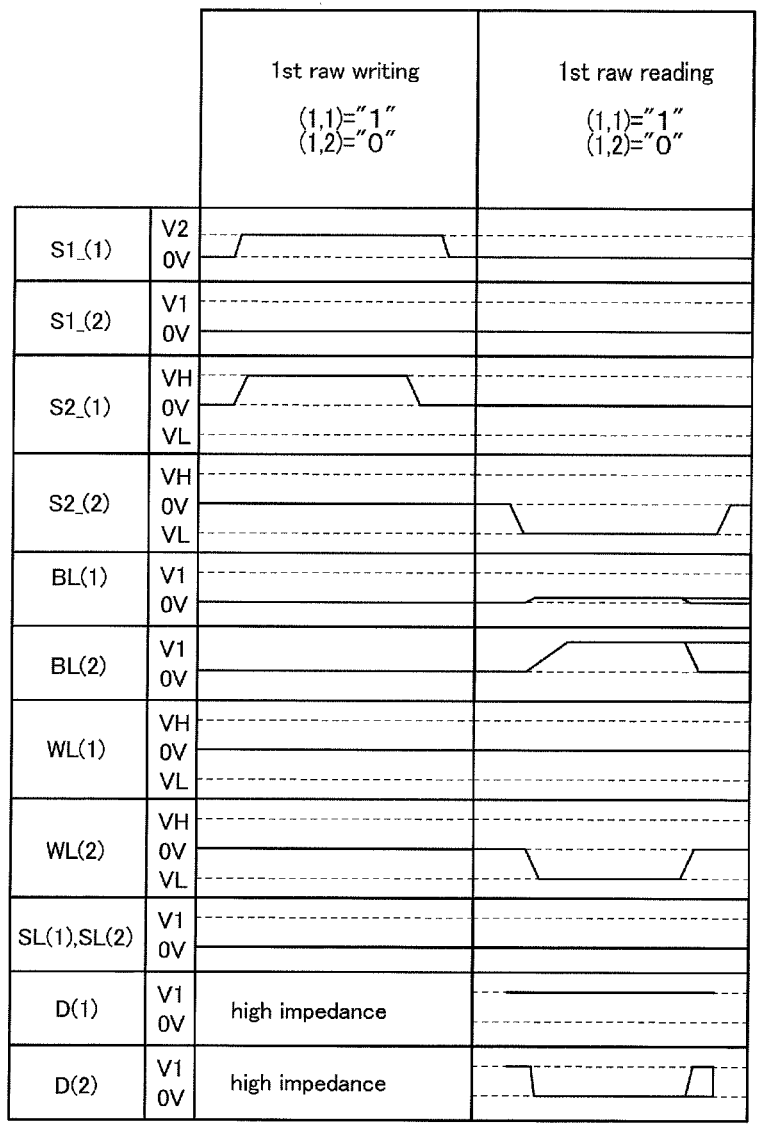
FIG. 3 illustrates the operation of the storage device in FIG. 2.

In FIG. 3, S1(1) and S1(2) are potentials of the first signal line S1, S2(1) and S2(2) are potentials of the second signal line S2, BL(1) and BL(2) are potentials of the bit line BL, WL(1) and WL(2) are potentials of the word line WL, and SL(1) and SL(2) are potentials of the source line SL.

First, the case in which data is written into the storage element 1100 (1,1) and the storage element 1100 (1,2) which are in the first row and data is read from the storage element 1100 (1,1) and the storage element 1100 (1,2) which are in the first row will be described. Note that in the following description, it is assumed that data to be written into the storage element 1100 (1,1) is "1" and data to be written into the storage element 1100 (1,2) is "0".

First, the writing operation will be described. In a writing period of the first row, a potential VH is supplied to the second signal line S2(1) in the first row so that the second transistors in the first row are turned on. Further, a potential 0 V is supplied to the second signal line S2(2) in the second row so that the second transistors in the second row are turned off.

Next, a potential V2 and a potential 0 V are applied to the first signal line S1(1) in the first column and the first signal line S1(2) in the second column, respectively.

As a result, the potential V2 and the potential 0 V are applied to a portion FG of the storage element 1100 (1,1) and a portion FG of the storage element 1100 (1,2), respectively. Here, the potential V2 is set higher than the threshold voltage of the first transistors. Then, the potential of the signal line S2(1) in the first row is set to 0 V so that the second transistors in the first row are turned off. Thus, the writing is terminated.

Note that the potentials of the word lines WL(1) and WL(2) are set to 0 V. Further, before the potential of the first signal line S1(1) in the first row is changed, the potential of the second signal line S2(1) in the first row is set to 0 V. The threshold voltage of a storage element into which data has been written is Vw0 in the case of data "0" and Vw1 in the case of data "1", assuming that a terminal connected to the word line WL is a control gate electrode, the source electrode of the first transistor is a source electrode, and the drain electrode of the second transistor is a drain electrode, in the storage element. Here, the threshold voltage of the storage element means a voltage of the terminal connected to the word line WL, which changes a resistance state between the source and drain electrodes of the first transistor. Note that Vw0>0>Vw1 is satisfied.

Next, the reading operation will be described. In a reading period in the first row, a potential 0 V and a potential VL are supplied to the word line WL(1) in the first row and the word line WL(2) in the second row, respectively. The potential VL is set lower than the threshold voltage of Vw1. When the potential WL(1) is set to 0 V, in the first row, the first transistor of the storage element 1100 (1,2) in which data "0" is stored is turned off, and the first transistor of the storage element 1100 (1,1) in which data "1" is stored is turned on. When the potential WL(2) is set to VL, in the second row, the second transistor is turned off even in the case of the storage elements 1100 in which either data "0" or data "1" is stored.

Next, a potential 0 V is supplied to the source line SL(1) in the first column and the source line SL(2) in the second column.

As a result, the first transistor of the storage element 1100 (1,1) between the bit line BL(1) and the source line SL(1) is on, thereby having a low resistance state, and the first transistor of the storage element 1100 (1,2) between the bit line BL(2) and the source line SL(2) is off, thereby having a high resistance state. A reading circuit connected to the bit line BL(1) and the bit line BL(2) can read data based on a difference in a resistance state between the bit lines.

Further, a potential 0 V and a potential VL are supplied to the second signal line S2(1) and the second signal line S2(2), respectively, so that all the second transistors are turned off. The potential of the portion FG in the first row is 0 V or V2; thus, the potential of the second signal line S2(1) is set to 0 V, whereby all the second transistors in the first row can be turned off. On the other hand, the potential of the portion FG in the second row is lower than the potential at the time directly after data writing if the potential VL is supplied to the word line WL(2). Accordingly, in order to prevent the second transistor from being turned on, the potential of the second signal line S2(2) is set to a low potential similarly to the potential of the word line WL(2). Thus, all the second transistors can be turned off.

As described above, a reading circuit is used for the reading operation.

Figure 4A:
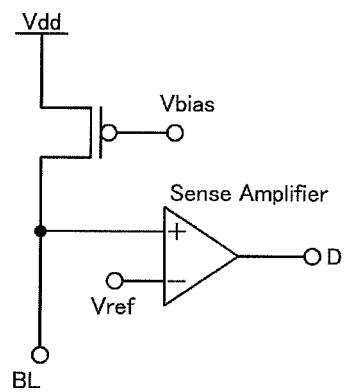
FIGS. 4A and 4B each illustrate a reading circuit of a storage device according to an embodiment of the present invention.

FIG. 4A illustrates an example of the reading circuit. The reading circuit illustrated in FIG. 4A includes a transistor and a sense amplifier circuit. A potential $V_{dd}$ is applied to one of source and drain electrodes of a transistor, and a + terminal of the sense amplifier circuit and a bit line are connected to the other of the source and drain electrodes of the transistor. A bias potential $V_{bias}$ is applied to a gate electrode of the transistor. Note that here, the bias potential $V_{bias}$ is higher than 0 and lower than $V_{dd}$.

In the case where the storage element has a high resistance, a potential which is inputted to the + terminal of the sense amplifier circuit is higher than a reference potential $V_{ref}$ and the sense amplifier circuit outputs data "1". On the other hand, in the case where the storage element has a low resistance, a potential which is inputted to a − terminal of the sense amplifier circuit is lower than the reference potential $V_{ref}$ and the sense amplifier circuit outputs data "0".

Figure 4B:
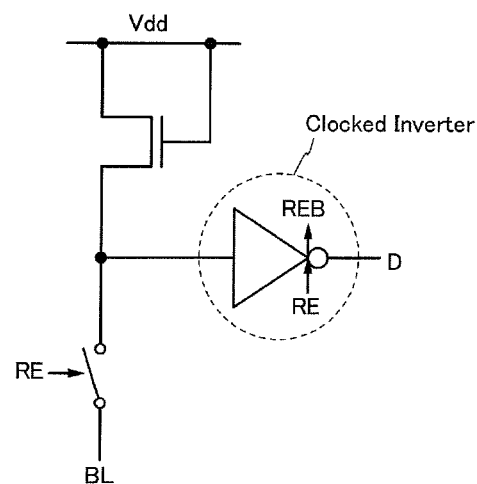

FIG. 4B illustrates another example of the reading circuit. The reading circuit illustrated in FIG. 4B includes a transistor and a clocked inverter. A potential $V_{dd}$ is applied to one of source and drain electrodes of a transistor, and an input of the clocked inverter and a bit line are connected to the other of the source and drain electrodes of the transistor. The potential $V_{dd}$ is also applied to a gate electrode of the transistor.

An output potential in the case where the reading circuit in FIG. 4B is used will be described. When the first transistor of the storage element 1100 (1, 1) is on, the resistance between the bit line BL(1) and the source line SL(1) is low. Therefore, the input of a clocked inverter has a low potential, and an output D(1) is a signal High. On the other hand, since the resistance between the bit line BL(2) and the source line SL(2) is high, a high potential is supplied to the clocked inverter and an output D(2) is a signal Low.

Note that the configuration of the reading circuit is not limited to the configuration of FIGS. 4A and 4B. For example, the reading circuit may include a precharge circuit, or a reference bit line may be connected to the sense amplifier circuit instead of the reference potential $V_{ref}$.

Although the storage device (FIG. 2) provided with the storage elements illustrated in FIGS. 1A and 1B is used here, the present invention is not limited thereto. With the use of the storage elements illustrated in FIGS. 1A and 1B, another storage device, a mode of which is different from that of FIG. 2, can also be formed.

Figure 5:
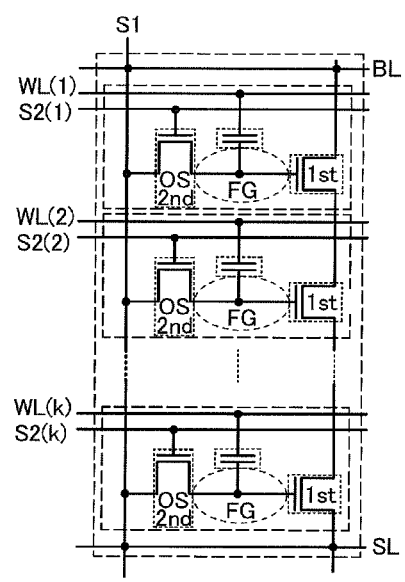
FIG. 5 illustrates a storage device according to an embodiment of the present invention.

FIG. 5 illustrates another storage device, a mode of which is different from that of FIG. 2, which is formed using the storage elements illustrated in FIGS. 1A and 1B. FIG. 5 illustrates a circuit diagram of a so-called NAND storage device in which storage elements are connected in series.

The storage device illustrated in FIG. 5 includes a source line SL, a bit line BL, a first signal line S1, a plurality of second signal lines S2, a plurality of word lines WL, and the plurality of storage elements. Note that in FIG. 5, one source line SL and one bit line BL are provided in the storage device; however, a plurality of source lines SL and a plurality of bit lines BL may be provided without limitation thereto.

In each of the storage elements illustrated in FIG. 5, one of source and drain electrodes of a second transistor (which corresponds to the transistor 162 in FIGS. 1A and 1B) is electrically connected to a first signal line S1, and a gate electrode of a second transistor is electrically connected to a second signal line S2. In addition, a gate electrode of a first transistor (which corresponds to the transistor 160 in FIGS. 1A and 1B) and the other of the source and drain electrodes of the second transistor are electrically connected to one of electrodes of the capacitor. The other of the electrodes of the capacitor is electrically connected to the word line WL.

Here, the source and drain electrodes of the first transistor included in each of k storage elements (k is a natural number) are sequentially connected in series between the source line SL and the bit line BL, a source electrode of a first transistor of a first storage element is electrically connected to the bit line BL, and a drain electrode of a first transistor of a $k^{th}$ storage element which is on the last stage is electrically connected to the source line SL.

In the storage device illustrated in FIG. 5, a writing operation and a reading operation are performed in each row. The writing operation is performed as follows. In other words, the second transistor in a row where writing is to be performed is turned on by the second signal line S2 of the row where writing is to be performed. Accordingly, a potential of the first signal line S1 is supplied to the gate electrode of the first transistor of the specified row, so that predetermined charge is injected into a portion FG. In this manner, data can be written into the storage element in the specified row.

Further, the reading operation is performed as follows. First, a potential at which the first transistor is turned on regardless of charge of the gate electrode of the first transistor is supplied to the word lines WL in rows other than a row where reading is to be performed, so that the first transistors in the rows other than the row where reading is to be performed are turned on. Then, a potential (reading potential) at which an on state or an off state of the first transistor is determined depending on charge in the gate electrode of the first transistor is supplied to the word line WL in the row where reading is to be performed. After that, a constant potential is supplied to the source line SL so that a reading circuit (not illustrated) connected to the bit line BL operates. Here, the plurality of first transistors between the source line SL and the bit line BL are on except the transistors in the row where reading is to be performed; therefore, conductance between the source line SL and the bit line BL is determined by a state of the first transistors in the row where reading is to be performed. That is, a potential of the bit line BL which is read by the reading circuit depends on charge in the gate electrodes of the first transistors in the row where reading is to be performed. In this a manner, data can be read from the storage element in the specified row.

Next, a top view and a cross-sectional view of the storage element illustrated in FIG. 1A according to an embodiment of the present invention will be described with reference to FIGS. 6A and 6B. Here, FIG. 6B is the top view, and FIG. 6A is the cross-sectional view taken along lines C1-C2 and D1-D2 of FIG. 6B.

Figure 6A:
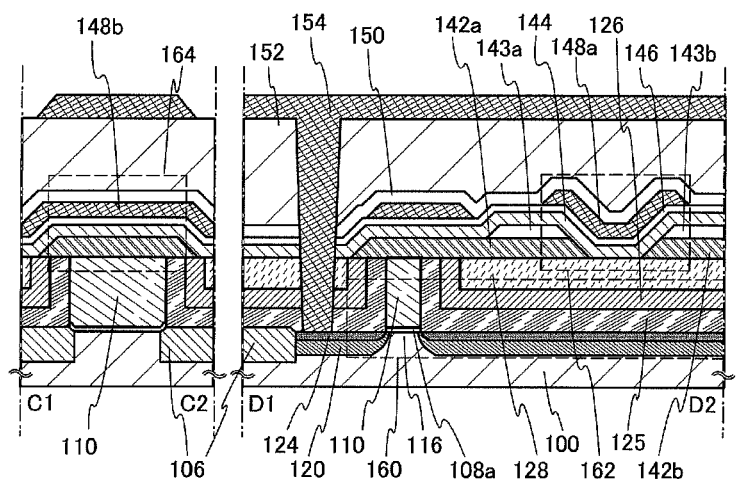
FIGS. 6A and 6B illustrate a storage element according to an embodiment of the present invention.
Figure 6B:
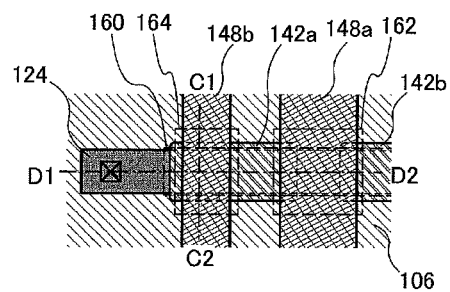

In the storage element illustrated in FIGS. 6A and 6B, the transistor 160 is provided over a substrate 100, at least a gate electrode 110 of the transistor 160 is exposed from an interlayer insulating layer 125, an interlayer insulating layer 126, and an interlayer insulating layer 128, and a source or drain electrode 142a of the transistor 162 is provided in contact with the exposed gate electrode 110. The source or drain electrode 142a functions not only as a source or drain electrode of the transistor 162 but also as an electrode of the capacitor 164. The capacitor 164 includes the source or drain electrode 142a, an electrode 148b, an oxide semiconductor layer 144, and a gate insulating layer 146. Here, the transistor 160 and the transistor 162 are provided so that at least part thereof overlap with each other.

Note that in FIGS. 6A and 6B, the transistor 160 is provided over the substrate 100. As the substrate 100, a substrate including a semiconductor material capable of operating at high speed may be used; for example, a single crystal silicon substrate can be used. The transistor 160 can operate at high speed particularly when a single crystal silicon substrate is used as the substrate 100.

Note that in FIGS. 6A and 6B, the transistor 162 is provided over the transistor 160. The transistor 162 includes the oxide semiconductor layer 144.

Although the transistor 160 and the transistor 162 are described here as n-channel transistors, p-channel transistors may also be used.

The transistor 160 includes a channel formation region 116 which is provided in the substrate 100 containing a semiconductor material, high-concentration impurity regions 120, a gate insulating layer 108a provided over the channel formation region 116, the gate electrode 110 provided over the gate insulating layer 108a, and a source or drain electrode 154 electrically connected to the high-concentration impurity region 120. A metal compound region 124 is provided between the high-concentration impurity region 120 and the source or drain electrode 154.

In addition, element isolation insulating layers 106 are provided in the vicinity of the surface of the substrate 100 so as to surround the transistor 160, and the interlayer insulating layer 125, the interlayer insulating layer 126, and the interlayer insulating layer 128 are provided to cover the transistor 160. The interlayer insulating layer 125, the interlayer insulating layer 126, and the interlayer insulating layer 128 are etched by CMP or the like after being formed to cover the transistor 160 until at least the gate electrode 110 is exposed.

The transistor 162 in FIGS. 6A and 6B includes the source or drain electrode 142a and a source or drain electrode 142b which are provided over the interlayer insulating layer 128, the oxide semiconductor layer 144, the gate insulating layer 146, and a gate electrode 148a. The oxide semiconductor layer 144 is provided between the source or drain electrode 142a and the source or drain electrode 142b in contact therewith, and the gate electrode 148a is provided overlapping with a channel formation region of the oxide semiconductor layer 144.

Here, the oxide semiconductor layer 144 is preferably an oxide semiconductor layer in which defect levels which are caused by oxygen deficiency are reduced by sufficiently removing an impurity such as hydrogen to have high purity and further by sufficiently supplying oxygen. Specifically, the concentration of hydrogen in the oxide semiconductor layer 144 is, for example, $5 \times 10^{19}/cm^3$ or less, preferably $5 \times 10^{18}/cm^3$ or less, or more preferably $5 \times 10^{17}/cm^3$ or less. Here, the concentration of hydrogen in the oxide semiconductor layer 144 is based on a measurement value by secondary ion mass spectroscopy (SIMS). Thus, a carrier concentration which is less than $1 \times 10^{12}/cm^3$, preferably less than $1 \times 10^{11}/cm^3$, or more preferably less than the measurement limit value is obtained in the oxide semiconductor layer in which defect levels in an energy gap which are caused by oxygen deficiency are reduced by sufficiently removing hydrogen to have high purity and further by sufficiently supplying oxygen. With the use of such an oxide semiconductor layer, the off-state current density (a value obtained by dividing the off-state current by the channel width of the transistor) at room temperature is 10 zA/μm to 100 zA/μm, for example. In this manner, when such an oxide semiconductor which is made to be i-type (intrinsic) or substantially i-type is used, a transistor having extremely low off-state current can be obtained.

Note that the oxide semiconductor layer 144 of the transistor 162 in FIGS. 6A and 6B is not processed into an island shape. Therefore, the oxide semiconductor layer 144 is prevented from being contaminated due to etching at the time of processing; thus, the oxide semiconductor layer 144 can be kept highly purified.

Note that in the capacitor 164 illustrated in FIGS. 6A and 6B, when the oxide semiconductor layer 144 and the gate insulating layer 146 are stacked, insulation between the source or drain electrode 142a and the electrode 148b can be ensured sufficiently.

Note that the source or drain electrode 142a and the source or drain electrode 142b are preferably formed to have tapered shapes. This is because coverage with the oxide semiconductor layer 144 can be increased and disconnection can be prevented. Here, the taper angle is set to, for example, 30° to 60° inclusive, which is particularly preferable. Note that the taper angle refers to an inclination angle (an internal angle) formed with a side surface and a bottom surface of a layer having a tapered shape (e.g., the source or drain electrode 142a) when seen from a direction perpendicular to a cross section (a plane perpendicular to a surface of a substrate) of the layer.

An interlayer insulating layer 150 is provided over the transistor 162 and the capacitor 164, and an interlayer insulating layer 152 is provided over the interlayer insulating layer 150.

Then, an opening that reaches the substrate 100 from the interlayer insulating layer 152 is provided, and the source or drain electrode 154 is provided over the interlayer insulating layer 152 and in the opening. The source or drain electrode 154 is provided so as to reach the metal compound region 124.

Note that the storage element according to an embodiment of the present invention is not limited to the storage element illustrated in FIGS. 6A and 6B.

Figure 7:
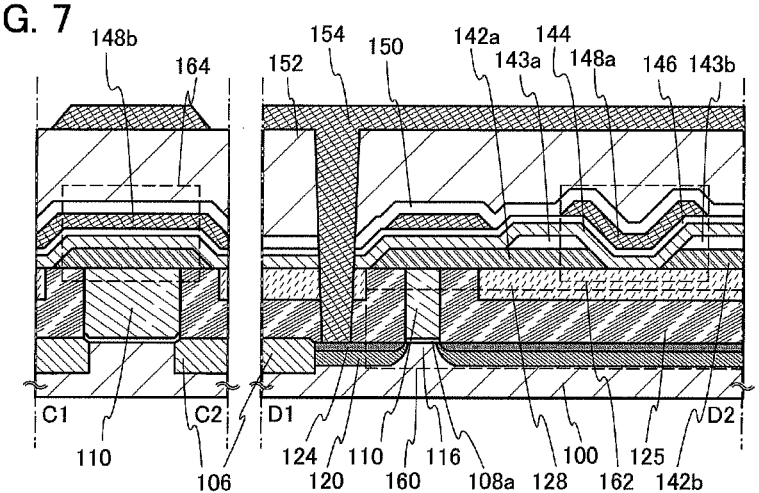
FIG. 7 illustrates a storage element according to an embodiment of the present invention.

For example, the interlayer insulating layer 126 may not be provided, which is illustrated in FIG. 7. When the interlayer insulating layer 126 is not formed, the number of steps is reduced and thus throughput can be improved.

Figure 8:
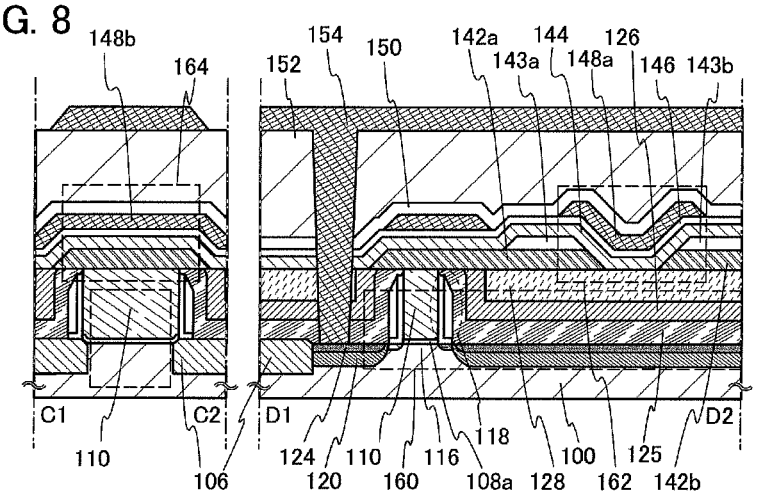
FIG. 8 illustrates a storage element according to an embodiment of the present invention.

Alternatively, as illustrated in FIG. 8, sidewall insulating layers 118 may be provided in contact with side surfaces of the gate insulating layer 108a and the gate electrode 110. In the case where the sidewall insulating layers 118 are provided, as will be described later, low-concentration impurity regions can be formed. An electric field in a vicinity of a drain edge can be relaxed by the low-concentration impurity region; therefore, the off-state current can be reduced.

Figure 9:
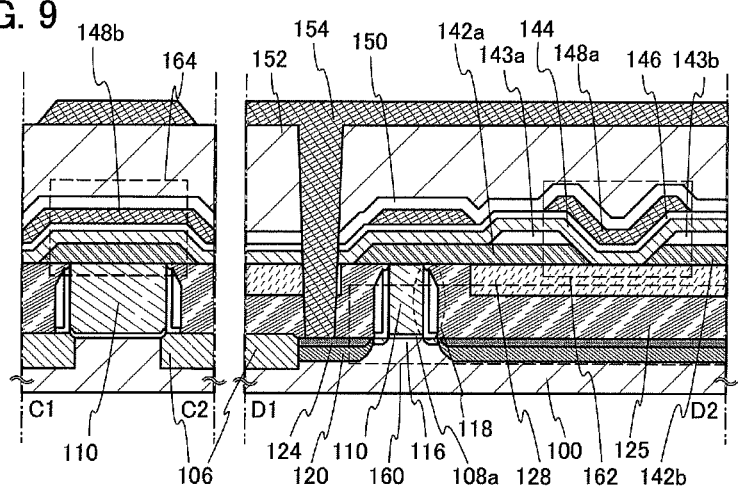
FIG. 9 illustrates a storage element according to an embodiment of the present invention.

Further alternatively, the structures in FIG. 7 and FIG. 8 may be combined as illustrated in FIG. 9.

Next, a manufacturing method of a transistor 160 included in the storage element illustrated in FIG. 8 will be described.

Figure 10A:
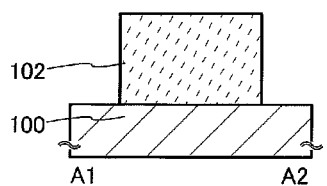
FIGS. 10A to 10H illustrate a manufacturing method of a storage element according to an embodiment of the present invention.

First, the substrate 100 including a semiconductor material is prepared (FIG. 10A). As the substrate 100 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of using a single crystal silicon substrate as the substrate 100 including a semiconductor material is shown. Note that in general, the term "SOI substrate" means a substrate where a silicon semiconductor layer is provided on an insulating surface. In this specification, the term "SOI substrate" also includes a substrate where a semiconductor layer formed using a semiconductor material other than silicon is provided on an insulating surface in its category. In other words, a semiconductor material included in the "SOI substrate" is not limited to silicon. Further, examples of the "SOI substrate" include a substrate which has a semiconductor layer over its insulating substrate such as a glass substrate, with an insulating layer between the semiconductor layer and the insulating substrate.

Next, a protective layer 102 serving as a mask for forming the element isolation insulating layers 106 is formed over the substrate 100 (FIG. 10A). As the protective layer 102, an insulating layer formed using silicon oxide, silicon oxynitride, silicon nitride oxide, silicon nitride, or the like can be used, for example. Note that before or after this step, an impurity element imparting n-type conductivity or an impurity element imparting p-type conductivity may be added to the substrate 100 in order to control the threshold voltage of the transistor. In the case where the substrate 100 is a silicon substrate, phosphorus (P), arsenic (As), or the like can be used as the impurity element imparting n-type conductivity. Boron (B), aluminum (Al), gallium (Ga), or the like can be used as the impurity element imparting p-type conductivity.

Note that "silicon oxynitride" contains more oxygen than nitrogen and, in the case where measurements are preferably performed using Rutherford backscattering spectrometry (RBS) and hydrogen forward scattering (HFS), includes oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively.

Further, "silicon nitride oxide" contains more nitrogen than oxygen and, in the case where measurements are preferably performed using RBS and HFS, includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

Figure 10E:
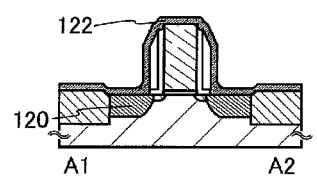
Figure 10B:
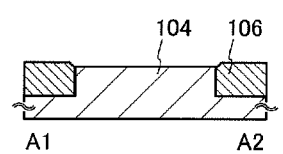

Next, part of the substrate 100 in a region not covered with the protective layer 102 (an exposed region) is removed by etching, using the protective layer 102 as a mask. Thus, a semiconductor region 104 which is isolated from another semiconductor region is formed (FIG. 10B). As the etching, dry etching is preferably performed, but wet etching may be performed. An etching gas and an etchant can be selected as appropriate depending on a material of the substrate to be etched.

Then, an insulating film is formed to cover at least the semiconductor region 104, and the insulating film in a region overlapping with the semiconductor region 104 is selectively removed, so that the element isolation insulating layers 106 are formed (FIG. 10B). The insulating film is preferably formed using silicon oxide, silicon oxynitride, silicon nitride oxide, silicon nitride, or the like. The insulating film may be removed with polishing treatment such as CMP, etching treatment, or the like. Note that the protective layer 102 is removed after the semiconductor region 104 is formed (or after the element insulation insulating layers 106 are formed).

Then, an insulating film is formed over the semiconductor region 104, and a conductive film is formed over the insulating film.

The insulating film formed in this step will serve as the gate insulating layer 108a later, which is preferably formed with a CVD method, a sputtering method, or the like as a single layer or stacked layers using a film containing any of silicon oxide, silicon oxynitride, silicon nitride oxide, silicon nitride, hafnium oxide, aluminum oxide, tantalum oxide, yttrium oxide, hafnium silicate, hafnium silicate to which nitrogen is added, hafnium aluminate to which nitrogen is added, and the like. Alternatively, the insulating film may be formed in such a manner that a surface of the semiconductor region 104 is oxidized or nitrided by high-density plasma treatment or thermal oxidation treatment. The high-density plasma treatment can be performed using, for example, a mixed gas of a rare gas such as helium (He), argon (Ar), krypton (Kr), or xenon (Xe) and a gas such as oxygen, nitrogen oxide, ammonia, nitrogen, or hydrogen. The thickness of the insulating film is preferably 1 nm to 100 nm inclusive, more preferably 10 nm to 50 nm inclusive.

The conductive film formed in this step can be formed using a metal material such as aluminum (Al), copper (Cu), titanium (Ti), tantalum (Ta), or tungsten (W) with an evaporation method, a CVD method, a sputtering method, a spin coating method, or the like. Alternatively, a semiconductor material such as polycrystalline silicon may be used. Note that an example of the case where the conductive film is formed using a metal material is shown.

After that, the gate insulating layer 108a and the gate electrode 110 are formed by selectively etching the insulating film and the conductive film.

Figure 10F:
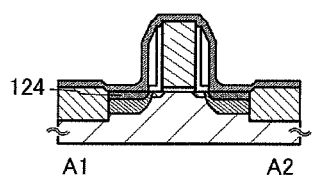
Figure 10C:
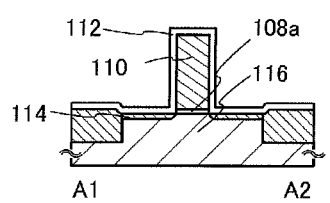

Next, an insulating film is formed to cover the gate electrode 110. Then, impurity regions 114 with a shallow junction depth are formed by adding phosphorus, arsenic, or the like to the semiconductor region 104, using the gate electrode 110 as a mask. Note that although phosphorus or arsenic is added in this step in order to form an n-channel transistor, another impurity element such as boron or aluminum may be added in the case where a p-channel transistor is formed. With the formation of the impurity regions 114, the channel formation region 116 is formed in the semiconductor region 104 below the gate insulating layer 108a (FIG. 10C). Although, in this step, the concentration of the added impurity can be set as appropriate, the concentration is preferably set to be high in the case where a semiconductor element is highly miniaturized. Note that although the step is employed in which the impurity regions 114 are formed after the insulating film 112 is formed, the insulating film 112 may be formed after the impurity regions 114 are formed.

Figure 10G:
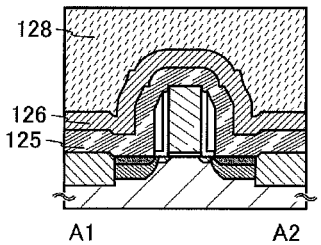
Figure 10D:
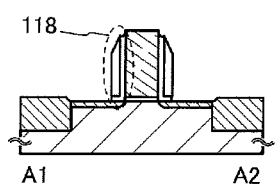

Next, the sidewall insulating layers 118 are formed (FIG. 10D). The sidewall insulating layers 118 can be formed in a self-aligned manner in such a manner that an insulating layer is formed to cover the insulating film 112 and then highly anisotropic etching is performed on the insulating film. Note that at this time, a top surface of the gate electrode 110 and top surfaces of the impurity regions 114 are preferably exposed by etching part of the insulating film 112. Note that the sidewall insulating layers 118 are not formed in some cases for the purpose of high integration or the like (e.g., FIGS. 6A and 6B).

Next, an insulating film is formed to cover the gate electrode 110, the impurity regions 114, the sidewall insulating layers 118, and the like. Then, the high-concentration impurity regions 120 are formed by adding phosphorus (P), arsenic (As), or the like to a region where the insulating layer is in contact with the impurity regions 114. After that, the insulating film is removed, and then a metal film 122 is formed to cover the gate electrode 110, the sidewall insulating layers 118, the high-concentration impurity regions 120, and the like (FIG. 10E). The metal film 122 can be formed with a variety of methods, such as a vacuum vapor deposition method, a sputtering method, or a spin coating method. The metal film 122 is preferably formed using a metal material that becomes low-resistance metal compound by reaction with a semiconductor material included in the semiconductor region 104. Examples of such a metal material include titanium (Ti), tantalum (Ta), tungsten (W), nickel (Ni), cobalt (Co), and platinum (Pt).

Next, heat treatment is performed, so that the metal film 122 reacts with the semiconductor material of the substrate 100. Accordingly, the metal compound regions 124 in contact with the high-concentration impurity regions 120 are formed (FIG. 10F). Note that in the case where the gate electrode 110 is formed using polycrystalline silicon or the like, a metal compound region is also formed in a region of the gate electrode 110 in contact with the metal film 122.

As the heat treatment, for example, irradiation with a flash lamp can be employed. Although it is needless to say that another heat treatment method may be used, a method with which heat treatment for an extremely short time can be achieved is preferably used in order to improve the controllability of chemical reaction in formation of the metal compound. Note that the metal compound regions described above are formed by reaction of the metal material and the semiconductor material and have sufficiently high conductivity. The formation of the metal compound regions can properly reduce the electric resistance and improve element characteristics. Note that the metal film 122 is removed after the metal compound regions 124 are formed.

Next, the interlayer insulating layer 125, the interlayer insulating layer 126, and the interlayer insulating layer 128 are formed to cover the components formed in the above steps (FIG. 10G). The interlayer insulating layer 125, the interlayer insulating layer 126, and the interlayer insulating layer 128 can be formed using a material containing an inorganic insulating material such as silicon oxide, silicon oxynitride, silicon nitride oxide, or silicon nitride. Alternatively, an organic insulating material such as polyimide or acrylic can be used. Note that although a stacked structure of the interlayer insulating layer 125, the interlayer insulating layer 126, and the interlayer insulating layer 128 is employed in this step, the present invention is not limited thereto.

The interlayer insulating layer 125 is preferably formed with a CVD method or the like, and the interlayer insulating layer 126 is preferably formed with a sputtering method in which the concentration of hydrogen or the like in an atmosphere during the film formation is sufficiently reduced. The interlayer insulating layer 125 is formed with a CVD method or the like, so that throughput can be improved; and the interlayer insulating layer 126 is formed with the sputtering method, so that an impurity such as water or hydrogen can be prevented from being mixed into the oxide semiconductor layer 144. Note that since the transistor 160 is formed using the silicon semiconductor, it is preferable to perform hydrogenation treatment. The hydrogenation treatment is preferably performed at a stage after the interlayer insulating layer 125 is formed or before the formation of the interlayer insulating layer 125.

Note that in the case where the storage element illustrated in FIGS. 6A and 6B is formed, a surface of the gate electrode 110 is exposed by the CMP or etching treatment after the formation of the interlayer insulating layer 125, the interlayer insulating layer 126, and the interlayer insulating layer 128.

Figure 10H:
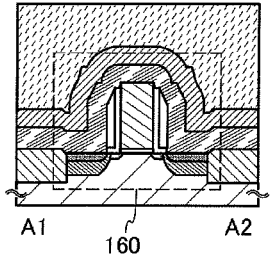

As described above, the transistor 160 is formed (FIG. 10H). The transistor 160 can operate at high speed; therefore, a logic circuit (also referred to as an arithmetic circuit) or the like can be formed using the transistor. In other words, the transistor can be used for a driver circuit or the like of a storage device.

Note that the storage element illustrated in FIGS. 6A and 6B may be manufactured in a manner similar to that of the above without the formation of the sidewall insulating layers 118.

Next, a manufacturing method of the transistor 162 illustrated in FIGS. 6A and 6B is described.

Figure 11A:
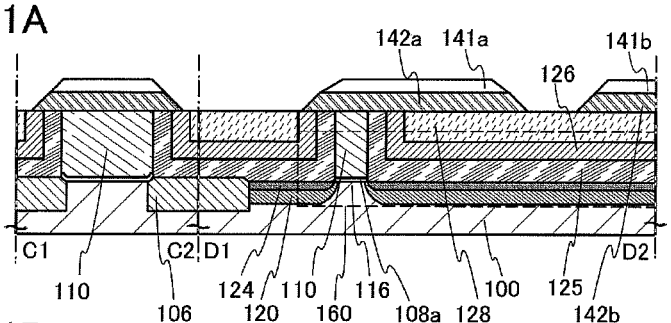
FIGS. 11A to 11D illustrate a manufacturing method of a storage element according to an embodiment of the present invention.

An insulating layer 141a, an insulating layer 141b, the source or drain electrode 142a, and the source or drain electrode 142b are formed in such a manner that a conductive film and an insulating film are formed over the gate electrode 110, the interlayer insulating layer 125, the interlayer insulating layer 126, and the interlayer insulating layer 128, and the conductive film and the insulating film are selectively etched (FIG. 11A). In this step, the source or drain electrode 142a is formed in direct contact with the gate electrode 110.

The conductive film for forming the source or drain electrode 142a and the source or drain electrode 142b can be formed in a manner similar to that of the other conductive films.

Figure 11B:
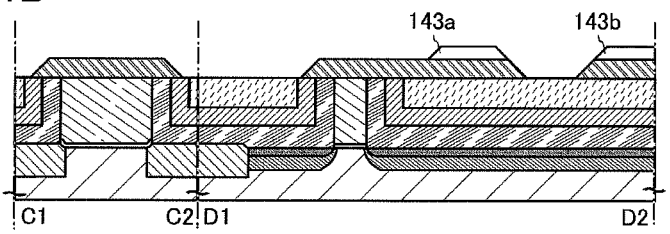

Next, an insulating layer 143a is formed over the source or drain electrode 142a and an insulating layer 143b is formed over the source or drain electrode 142b by selectively etching the insulating layer 141a and the insulating layer 141b (FIG. 11B).

By providing the insulating layer 143a and the insulating layer 143b, parasitic capacitance formed between a gate electrode to be formed later and the source or drain electrode 142a or between the gate electrode and the source or drain electrode 142b can be reduced.

Note that the process for forming the insulating layer 143a and the insulating layer 143b is not limited to the above process. For example, the insulating layer 143a and the insulating layer 143b may be formed in such a manner that the source or drain electrode 142a and the source or drain electrode 142b are formed, an insulating film is formed to cover them, and then the insulating film is selectively etched.

Figure 11C:
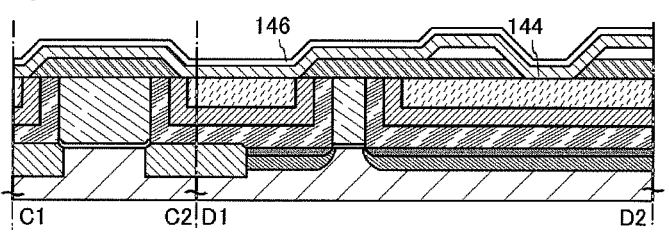

Next, a gate insulating layer 146 is formed over the oxide semiconductor layer 144 which is formed to cover the source or drain electrode 142a and the source or drain electrode 142b (FIG. 11C).

As the oxide semiconductor layer 144, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor which are one-component metal oxides.

In particular, an In—Ga—Zn—O-based oxide semiconductor material has sufficiently high resistance when there is no electric field; thus, sufficiently low off-state current can be obtained. In addition, having a high field-effect mobility, the In—Ga—Zn—O-based oxide semiconductor material is preferable as a semiconductor material.

Typical examples of the In—Ga—Zn—O-based oxide semiconductor material include an oxide semiconductor material represented by $InGaO_3(ZnO)_m$ (m>0). Moreover, there is an oxide semiconductor material represented by InMO$_3$(ZnO)$_m$ (m>0), using M instead of Ga. Note that M represents one or a plurality of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above compositions are derived from the crystal structures that the oxide semiconductor material can have and are mere examples.

As a target for manufacturing the oxide semiconductor layer 144 with a sputtering method, a target represented by a compositional formula of In:Ga:Zn=1:x:y (x is greater than or equal to 0 and y is 0.5 to 5 inclusive) is preferably used. For example, a target with a composition ratio of In:Ga:Zn=1:1:1 [atomic ratio] (x=1 and y=1; that is, In$_2$O$_3$:Ga$_2$O$_3$:ZnO=1:1:2 [molar ratio]) can be used. Alternatively, a target with a composition ratio of In:Ga:Zn=1:1:0.5 [atomic ratio] (x=1, y=0.5), a target with a composition ratio of In:Ga:Zn=1:1:2 [atomic ratio] (x=1, y=2), or a target with a composition ratio of In:Ga:Zn=1:0:1 [atomic ratio] (x=0, y=1) can be used.

The relative density of the metal oxide in the metal oxide target is greater than or equal to 80%, preferably greater than or equal to 95%, or more preferably greater than or equal to 99.9%. The use of the metal oxide target with high relative density makes it possible to form the oxide semiconductor layer 144 having a dense structure.

The atmosphere in which the oxide semiconductor layer 144 is formed is preferably a rare gas (argon (Ar) as a preferable example) atmosphere, an oxygen atmosphere, or a mixed atmosphere of a rare gas (argon (Ar) as a preferable example) and oxygen. Specifically, it is preferable to use, for example, a high-purity gas atmosphere from which an impurity such as hydrogen, water, hydroxyl, or hydride is removed to a concentration of 1 ppm or less (preferably, 10 ppb or less).

At the time of forming the oxide semiconductor layer 144, for example, an object is held in a treatment chamber kept under reduced pressure and the object is heated to a temperature higher than or equal to 100° C. and lower than 550° C., preferably 200° C. to 400° C. inclusive. Alternatively, the temperature of the object at the time of forming the oxide semiconductor layer 144 may be room temperature. Then, a sputtering gas from which hydrogen, water, or the like is removed is introduced into the treatment chamber while moisture in the treatment chamber is removed, whereby the oxide semiconductor layer 144 is formed using the target described above. By forming the oxide semiconductor layer 144 while the object is heated, an impurity included in the oxide semiconductor layer 144 can be reduced. Moreover, damage due to sputtering can be reduced. In order to remove moisture in the treatment chamber, an entrapment vacuum pump is preferably used. For example, a cryopump, an ion pump, or a titanium sublimation pump can be used. A turbo pump provided with a cold trap may also be used. By evacuation with the cryopump or the like, hydrogen, water, or the like can be removed from the treatment chamber, so that the impurity concentration in the oxide semiconductor layer 144 can be reduced.

For example, the conditions for forming the oxide semiconductor layer 144 can be set as follows: the distance between the object and the target is 170 mm, the pressure is 0.4 Pa, the direct current (DC) power is 0.5 kW, and the atmosphere is an oxygen (oxygen: 100%) atmosphere, an argon (Ar) (argon (Ar): 100%) atmosphere, or a mixed atmosphere of oxygen and argon (Ar). Note that it is preferable to use a pulsed direct-current (DC) power source because generation of dust (such as powder substances formed at the time of the film formation) can be suppressed and the thickness distribution is uniform. The thickness of the oxide semiconductor layer 144 is 1 nm to 50 nm inclusive, preferably 1 nm to 30 nm inclusive, or more preferably 1 nm to 10 nm inclusive. Using the oxide semiconductor layer 144 with such a thickness can suppress a short-channel effect due to miniaturization. Note that the appropriate thickness of the oxide semiconductor layer differs depending on the oxide semiconductor material to be used, the intended purpose of a storage device, or the like; therefore, the thickness can also be determined in accordance with the material, the intended purpose, or the like.

Note that before the oxide semiconductor layer 144 is formed with a sputtering method, a material attached to a surface on which the oxide semiconductor layer 144 is formed (e.g., a surface of the interlayer insulating layer 128) is preferably removed by reverse sputtering in which an argon (Ar) gas is introduced and plasma is generated. Here, the reverse sputtering is a method with which ions collide with a surface to be processed so that the surface is modified, in contrast to a normal sputtering method with which ions collide with a sputtering target. A method for making ions collide to a surface to be treated includes a method in which high-frequency voltage is applied on the surface in an argon (Ar) atmosphere and plasma is generated in the vicinity of the object. Note that a nitrogen atmosphere, a helium atmosphere, or an oxygen atmosphere may be used instead of an argon (Ar) atmosphere.

After that, heat treatment (first heat treatment) is preferably performed on the oxide semiconductor layer 144. Excess hydrogen (including water and hydroxyl) in the oxide semiconductor layer 144 can be removed by the first heat treatment; thus, the structure of the oxide semiconductor layer can be improved and a defect level in an energy gap can be reduced. The first heat treatment is performed at a temperature higher than or equal to 300° C. and lower than 550° C., or a temperature at 400° C. to 500° C. inclusive, for example.

Note that the heat treatment can be performed in such a manner that, for example, an object is introduced into an electric furnace in which a resistance heating element or the like is used, and heated at 450° C. in a nitrogen atmosphere for 1 hour. The oxide semiconductor layer 144 is not exposed to the air during the heat treatment so that entry of water or hydrogen can be prevented.

The heat treatment apparatus is not limited to an electric furnace and the heat treatment apparatus can be an apparatus that heats an object with thermal conduction or thermal radiation given by a medium such as a heated gas. For example, an RTA (rapid thermal anneal) apparatus such as a GRTA (gas rapid thermal anneal) apparatus or an LRTA (lamp rapid thermal anneal) apparatus can be used as the heat treatment apparatus. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. An inert gas that does not react with an object by heat treatment, for example, nitrogen or a rare gas such as argon (Ar) is used.

For example, as the first heat treatment, a GRTA process may be performed as follows. The object is put in an inert gas atmosphere which is heated, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process. This is because defect level in energy gap due to oxygen deficiency can be reduced by performing the first heat treatment in an atmosphere including oxygen.

Note that the inert gas atmosphere is preferably an atmosphere which contains nitrogen or a rare gas (such as helium (He), neon (Ne), or argon (Ar)) as its main component and does not contain water, hydrogen or the like. For example, the purity of nitrogen or a rare gas such as helium (He), neon (Ne), or argon (Ar) introduced into the heat treatment apparatus is set to 6N (99.9999%) or more, preferably 7N (99.99999%) or more (i.e., the impurity concentration is 1 ppm or less, preferably 0.1 ppm or less).

In any case, the i-type (intrinsic) or substantially i-type oxide semiconductor layer 144 in which an impurity is reduced by the first heat treatment is formed, whereby a transistor having extremely excellent characteristics can be realized.

The above heat treatment (first heat treatment) has an effect of removing hydrogen, water, and the like and can be referred to as dehydration treatment, dehydrogenation treatment, or the like. The dehydration treatment or dehydrogenation treatment can be performed, for example, after the oxide semiconductor layer is formed, after the gate insulating layer is formed, or after the gate electrode is formed. Note that such dehydration treatment or dehydrogenation treatment may be performed once or plural times.

The gate insulating layer 146 is preferably formed with a CVD method, a sputtering method, or the like as a single layer or stacked layers using a film containing any of silicon oxide, silicon oxynitride, silicon nitride oxide, silicon nitride, hafnium oxide, aluminum oxide, tantalum oxide, yttrium oxide, hafnium silicate, hafnium silicate to which nitrogen is added, hafnium aluminate to which nitrogen is added, and the like. In this step, the thickness of the insulating film is preferably 1 nm to 100 nm inclusive, more preferably 10 nm to 50 nm inclusive. Note that after the gate insulating layer 146 is formed, it is preferable to perform heat treatment (second heat treatment) in an inert gas atmosphere or an oxygen atmosphere.

Note that the gate insulating layer 146 is preferably formed with a sputtering method. The gate insulating layer 146 is formed with a sputtering method, so that an impurity such as water or hydrogen can be prevented from being mixed into the oxide semiconductor layer 144.

Figure 11D:
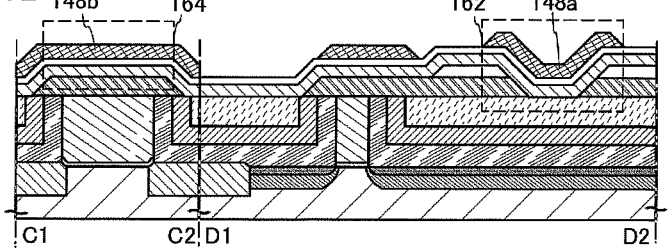

Next, over the gate insulating layer 146, the gate electrode 148a is formed in a region overlapping with a region of the transistor 162, which serves as a channel formation region, and the electrode 148b is formed in a region overlapping with the source or drain electrode 142a (FIG. 11D).

The gate electrode 148a and the electrode 148b can be formed in such a manner that a conductive film is formed over the gate insulating layer 146 and then etched selectively. The conductive film to be the gate electrode 148a and the electrode 148b can be formed with a PVD method typified by a sputtering method or a CVD method such as a plasma CVD method. The details are similar to those of the source or drain electrode 142a or the like.

Figure 12A:
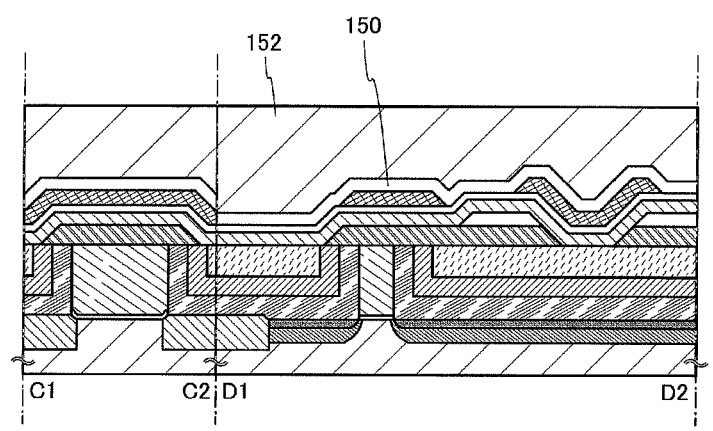
FIGS. 12A and 12B illustrate a manufacturing method of a storage element according to an embodiment of the present invention.

Next, the interlayer insulating layer 150 and the interlayer insulating layer 152 are formed over the gate insulating layer 146, the gate electrode 148a, and the electrode 148b (FIG. 12A).

Note that the interlayer insulating layer 152 is preferably formed so as to have a planarized surface. This is because the formation of the interlayer insulating layer 152 which is performed to have a planarized surface makes it possible to form an electrode, a wiring, or the like preferably over the interlayer insulating layer 152 even in the case where, for example, the storage element is miniaturized. Note that the interlayer insulating layer 152 can be planarized with a method such as CMP (chemical mechanical polishing).

Figure 12B:
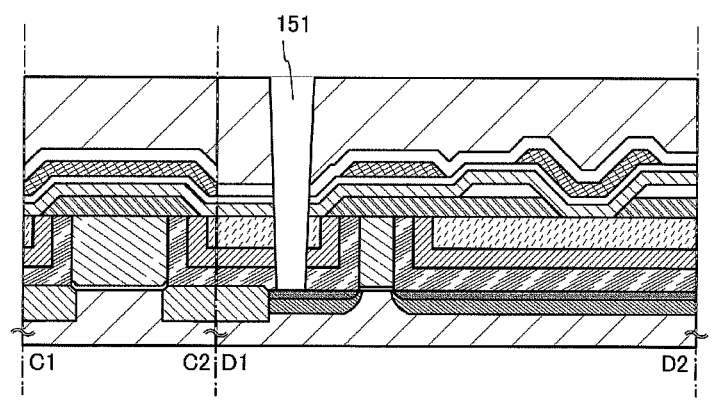

Next, the interlayer insulating layer 125, the interlayer insulating layer 126, the interlayer insulating layer 128, the oxide semiconductor layer 144, the gate insulating layer 146, the interlayer insulating layer 150, and the interlayer insulating layer 152 are selectively etched so that an opening 151 that reaches the metal compound region 124 of the transistor 160 is formed (FIG. 12B). As the etching, either dry etching or wet etching may be used, but dry etching is preferably employed in terms of microfabrication.

Then, a conductive film is formed so as to fill the opening 151 and etched, so that the source or drain electrode 154 can be formed and thus the storage element illustrated in FIGS. 6A and 6B is completed. At the time of forming the conductive film, for example, a titanium film is formed to have a small thickness with a PVD method in a region including the opening and a titanium nitride film is then formed to have a small thickness with a CVD method; and then, a tungsten film is formed so as to be embedded in the opening. The titanium film formed with a PVD method has a function of reducing a surface of an oxide film (e.g., a native oxide film), on which the titanium film is formed, to decrease the contact resistance with the lower electrodes (e.g., the metal compound regions 124 in this step). The titanium nitride film formed after the formation of the titanium film has a barrier function of preventing diffusion of the conductive film. After the barrier film is formed using titanium, titanium nitride, or the like, a copper film may be formed by plating.

Note that the storage elements illustrated in FIG. 7 and FIG. 9 can also be formed through the above process in a manner similar to that of the storage elements illustrated in FIGS. 6A and 6B and FIG. 8.

As described above, the storage device including the transistor 160, the transistor 162, and the capacitor 164 can be manufactured.

Note that an electrode, a wiring, an insulating layer, or the like may be formed as well after the above process. When the wiring has a multi-layer structure of a stacked structure including an interlayer insulating layer and a conductive layer, a highly integrated storage device can be provided.

Note that the manufacturing method of the transistor 162 is not limited to the above process in an embodiment of the present invention. Alternatively, the transistor 162 may be formed by patterning the oxide semiconductor layer 144 as appropriate, for example.

Next, a manufacturing method of an SOI substrate where a single crystal semiconductor layer is provided over a base substrate will be described with reference to FIGS. 13A to 13H; then, a manufacturing method of a transistor using the SOI substrate will be described with reference to FIGS. 14A to 14H.

First, a base substrate 500 is prepared (FIG. 13A). As the base substrate 500, a substrate made of an insulator can be used. Specific examples thereof include a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, a ceramic substrate which contains silicon nitride and aluminum oxide as its main components and whose thermal expansion coefficient is close to that of silicon may be used.

Note that a semiconductor substrate such as a single crystal silicon substrate or a single crystal germanium substrate may be used as the base substrate 500. In the case where a semiconductor substrate is used as the base substrate 500, an SOI substrate with high quality can be easily obtained because the temperature condition for heat treatment is eased as compared to the case where a glass substrate or the like is used. As a semiconductor substrate, a solar grade silicon (SOG-Si) substrate or the like may be used. Alternatively, a polycrystalline semiconductor substrate may be used. In the case where a SOG-Si substrate, a polycrystalline semiconductor substrate, or the like is used, manufacturing cost can be reduced as compared to the case where a single crystal silicon substrate or the like is used.

Here, the case where a glass substrate is used as the base substrate 500 is described. When a glass substrate that can be manufactured in large sizes and is inexpensive is used as the base substrate 500, cost reduction can be achieved.

The surface of the base substrate 500 is preferably cleaned in advance. Specifically, the base substrate 500 may be subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, the planarity of the surface of the base substrate 500 can be improved and abrasive particles remaining on the surface of the base substrate 500 can be removed.

Next, a nitrogen-containing layer 502 (e.g., a layer including an insulating film containing nitrogen, such as a silicon nitride film) is formed on the surface of the base substrate 500 (FIG. 13B). The nitrogen-containing layer 502 can be formed with a CVD method, a sputtering method, or the like.

The nitrogen-containing layer 502 formed in this step serves as a layer for bonding a single crystal semiconductor layer (as a bonding layer) in a later step. The nitrogen-containing layer 502 also functions as a barrier layer for preventing an impurity included in the base substrate, such as sodium (Na), from diffusing into the single crystal semiconductor layer.

Since the nitrogen-containing layer 502 is used as the bonding layer, it is preferable that the nitrogen-containing layer 502 be formed to have a certain level of surface planarity. Specifically, the nitrogen-containing layer 502 is formed such that it has an average surface roughness ($R_a$, which is also referred to as arithmetic mean deviation) of 0.5 nm or less and a root-mean-square surface roughness ($R_{ms}$) of 0.60 nm or less, preferably an average surface roughness of 0.35 nm or less and a root-mean-square surface roughness of 0.45 nm or less. Note that for the above average surface roughness or root-mean-square roughness, for example, a value obtained by the measurement performed on a region of 10 μm×10 μm can be used. The thickness is in the range of 10 nm to 200 nm inclusive, preferably 50 nm to 100 nm inclusive. With the surface flatness improved as described above, the bonding defect of the single crystal semiconductor layer can be prevented.

Next, a bond substrate is prepared. In this step, a single crystal semiconductor substrate 510 is used as the bond substrate (FIG. 13C). Note that although a single crystal semiconductor substrate is used as the bond substrate, the bond substrate is not limited thereto.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Alternatively, a compound semiconductor of gallium arsenide, indium phosphide, or the like may be used. Note that the single crystal semiconductor substrate 510 is not limited to a circular substrate and may be a substrate which has been processed into, for example, a rectangular shape. Further, the single crystal semiconductor substrate 510 can be formed with a Czochralski (CZ) method or a Floating Zone (FZ) method.

An oxide film 512 is formed on a surface of the single crystal semiconductor substrate 510 (FIG. 13D). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the oxide film 512 is formed. Dilute hydrofluoric acid and ozone water may be discharged alternately for cleaning.

The oxide film 512 can be formed as a single layer or stacked layers using, for example, a silicon oxide film, a silicon oxynitride film, or the like. Examples of a formation method of the oxide film 512 include a thermal oxidation method, a CVD method, or a sputtering method. Note that in the case where the oxide film 512 is formed with a CVD method or the like, a silicon oxide film is preferably formed using organosilane such as tetraethoxysilane (abbreviation: TEOS) (chemical formula: $Si(OC_2H_5)_4$), so that favorable bonding can be achieved.

In this step, the oxide film 512 (here, a silicon oxide film) is formed by performing thermal oxidation treatment on the single crystal semiconductor substrate 510. The thermal oxidation treatment is preferably performed in an oxidizing atmosphere to which a halogen is added.

For example, thermal oxidation treatment is subjected to the single crystal semiconductor substrate 510 in an oxidizing atmosphere to which chlorine is added, whereby the oxide film 512 which is oxidized by chlorine can be formed. In this case, the oxide film 512 is a film containing chlorine atoms. By such chlorine oxidation, heavy metal (e.g., iron (Fe), chromium (Cr), nickel (Ni), or molybdenum (Mo)) that is an extrinsic impurity is trapped and chloride of the metal is formed and then removed; thus, contamination of the single crystal semiconductor substrate 510 can be reduced. Moreover, after the bonding to the base substrate 500, impurity from the base substrate, such as sodium (Na), can be fixed so that contamination of the single crystal semiconductor substrate 510 can be prevented.

Further, halogen atoms contained in the oxide film 512 are not limited to chlorine atoms. Fluorine atoms may be contained in the oxide film 512. Examples of a method for fluorine oxidation of the surface of the single crystal semiconductor substrate 510 include a method in which the single crystal semiconductor substrate 510 is soaked in an HF solution and then subjected to thermal oxidation treatment in an oxidizing atmosphere and a method in which thermal oxidation treatment is performed in an oxidizing atmosphere to which $NF_3$ is added.

Next, ions are accelerated by an electric field, the single crystal semiconductor substrate 510 is irradiated with the ions, and the ions are added thereto, whereby an embrittlement region 514 where the crystal structure is damaged is formed at a predetermined depth of the single crystal semiconductor substrate 510 (FIG. 13E).

The depth at which the embrittlement region 514 is formed can be controlled by the kinetic energy, mass, charge, or incidence angle of the ions, or the like. The embrittlement region 514 is formed at approximately the same depth as the average penetration depth of the ions. Therefore, the thickness of a single crystal semiconductor layer to be separated from the single crystal semiconductor substrate 510 can be controlled by the depth at which the ions are added. For example, the average penetration depth of the ions may be adjusted such that the thickness of the single crystal semiconductor layer is 10 nm to 500 nm inclusive, preferably 50 nm to 200 nm inclusive.

The ion irradiation treatment can be performed with an ion-doping apparatus or an ion-implantation apparatus. Examples of the ion-doping apparatus include a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, the ion-implantation apparatus is a mass-separation type apparatus. In the ion-implantation apparatus, mass separation of ion species of plasma is performed and the object to be processed is irradiated with ion species having predetermined masses.

Next, an example is described in which an ion-doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set to 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium (He) or the like may be added. Further, ions to be added are not limited to one kind of ions, and plural kinds of ions may be added. For example, in the case where irradiation with hydrogen and helium (He) is performed at the same time using an ion-doping apparatus, the number of steps can be reduced as compared to the case where irradiation of hydrogen and helium is performed in separate steps, and surface roughness of a single crystal semiconductor layer to be formed later can be suppressed.

Note that there is a possibility that a heavy metal might be added to the single crystal semiconductor substrate 510 at the same time when the embrittlement region 514 is formed using the ion-doping apparatus; however, the ion irradiation is performed through the oxide film 512 containing halogen atoms, so that contamination of the single crystal semiconductor substrate 510 due to the heavy metal can be prevented.

Next, the base substrate 500 and the single crystal semiconductor substrate 510 are disposed to face each other and the surface of the nitrogen-containing layer 502 and the surface of the oxide film 512 are disposed in close contact with each other. The base substrate 500 and the single crystal semiconductor substrate 510 are bonded to each other in such a manner that the surface of the nitrogen-containing layer 502 and the surface of the oxide film 512 are disposed in close contact with each other as described above (FIG. 13F).

When the base substrate 500 and the single crystal semiconductor substrate 510 are bonded to each other, it is preferable that a pressure of 0.001 N/cm² to 100 N/cm² inclusive, more preferably a pressure of 1 N/cm² to 20 N/cm² inclusive be applied to one part of the base substrate 500 or one part of the single crystal semiconductor substrate 510. When the bonding surfaces are made close to each other and disposed in close contact with each other by applying a pressure in such a manner, a bonding between the nitrogen-containing layer 502 and the oxide film 512 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, surfaces to be bonded to each other are preferably subjected to surface treatment. By the surface treatment, bonding strength at the bonding surface can be improved.

As the surface treatment, wet treatment, dry treatment, or a combination of wet treatment and dry treatment can be used. Alternatively, a plurality of different wet treatments may be combined, or a plurality of different dry treatments may be combined.

Note that after the single crystal semiconductor substrate 510 and the base substrate 500 are bonded to each other, it is preferable to perform heat treatment for further strengthening a bond. This heat treatment is performed at a temperature at which separation at the embrittlement region 514 does not occur (e.g., higher than or equal to room temperature and lower than 400° C.). Alternatively, the nitrogen-containing layer 502 and the oxide film 512 may be bonded to each other while being heated at a temperature within this range. The thermal treatment can be performed using a heating furnace such as a diffusion furnace or a resistance heating furnace, a RTA (rapid thermal annealing) apparatus, a microwave heating apparatus, or the like. Note that the above temperature condition is an example and is not limited thereto.

Next, heat treatment is performed for separation of the single crystal semiconductor substrate 510 at the embrittlement region, whereby a single crystal semiconductor layer 516 is formed over the base substrate 500 with the nitrogen-containing layer 502 and the oxide film 512 interposed therebetween (FIG. 13G).

Note that the temperature for heat treatment at the time of the separation described above is preferably as low as possible. This is because the lower the temperature for the heat treatment at the time of the separation is, the more surface roughness of the single crystal semiconductor layer 516 can be suppressed. Specifically, the temperature for the heat treatment at the time of the separation described above may be 300° C. to 600° C. inclusive and the heat treatment is more effective when the temperature is lower than or equal to 500° C. (higher than or equal to 400° C.).

Note that after the single crystal semiconductor substrate 510 is separated, heat treatment may be performed on the single crystal semiconductor layer 516 at a temperature of 500° C. or higher so that the concentration of hydrogen that remains in the single crystal semiconductor layer 516 is reduced.

Next, a surface of the single crystal semiconductor layer 516 is irradiated with laser light, whereby a single crystal semiconductor layer 518 where the flatness of the surface planarity is improved and which has fewer defects is formed. Note that instead of the laser light irradiation treatment, heat treatment may be performed.

Although the irradiation treatment with the laser light is performed in this step just after the heat treatment at the time of the separation of the single crystal semiconductor layer 516, the present invention is not limited thereto. Etching treatment may be performed after the heat treatment at the time of the separation of the single crystal semiconductor layer 516 to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Alternatively, a step of reducing the thickness of the single crystal semiconductor layer 516 may be performed after the laser light irradiation as described above. In order to reduce the thickness of the single crystal semiconductor layer 516, any one of dry etching and wet etching or both of them may be employed.

Through the above steps, an SOI substrate having the single crystal semiconductor layer 518 with favorable characteristics can be obtained (FIG. 13H).

Next, the manufacturing method of a transistor 570 including the SOI substrate described above will be described with reference to FIGS. 14A to 14H.

Figure 14A:
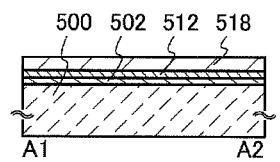
FIGS. 14A to 14H illustrate a manufacturing method of a storage element according to an embodiment of the present invention.

FIG. 14A is a cross-sectional view illustrating part of an SOI substrate manufactured with the method which is illustrated in FIGS. 13A to 13H.

Figure 14E:
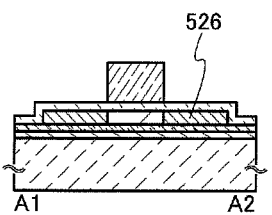
Figure 14B:
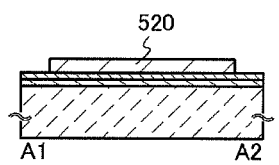
Figure 14F:
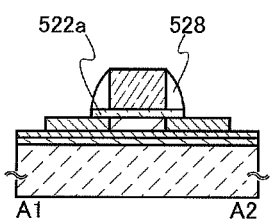

First, the single crystal semiconductor layer 518 is processed into an island shape so that a semiconductor layer 520 is formed (FIG. 14B). Note that before or after this step, an impurity element imparting n-type conductivity or an impurity element imparting p-type conductivity may be added to the semiconductor layer in order to control the threshold voltage of the transistor. In the case where the semiconductor is silicon, phosphorus (P), arsenic (As), or the like can be used as the impurity element imparting n-type conductivity. Boron (B), aluminum (Al), gallium (Ga), or the like can be used as the impurity element imparting p-type conductivity.

Figure 14C:
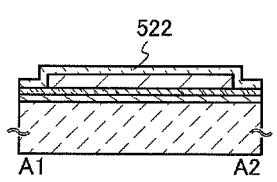

Next, an insulating layer 522 is formed to cover the semiconductor layer 520 (FIG. 14C). The insulating layer 522 is to be a gate insulating layer later. In this step, a single layer of a silicon oxide film is formed with a plasma CVD method. The material and the formation method of the insulating layer 522 are not particularly limited.

Figure 14G:
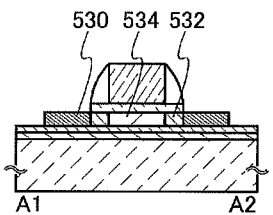
Figure 14D:
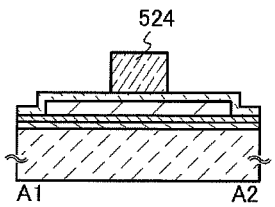

Next, after a conductive film is formed over the insulating layer 522, the conductive layer is selectively etched so that a gate electrode 524 is formed above the semiconductor layer 520 so as to overlap with each other (FIG. 14D). The material and the formation method of the gate electrode 524 are not particularly limited.

Next, impurity regions 526 are formed by adding an impurity element imparting one conductivity type to the semiconductor layer 520, using the gate electrode 524 as a mask (FIG. 14E). Note that although phosphorus or arsenic is added in this step in order to form an n-channel transistor, another impurity element such as boron or aluminum may be added in the case where a p-channel transistor is formed.

Next, sidewall insulating layers 528 are formed on side surfaces of the gate electrode 524. The sidewall insulating layers 528 can be formed in a self-aligned manner in such a manner that an insulating layer is formed to cover the insulating layer 522 and the gate electrode 524 and then highly anisotropic etching is performed on the insulating layer. Note that at this time, it is preferable to expose the impurity regions 526 together with the formation of the gate insulating layer 522a by partly etching the insulating layer 522.

Next, an impurity element imparting one conductivity type is added to the impurity regions 526, using the gate electrode 524 and the sidewall insulating layers 528 as masks. Note that the impurity element added to the impurity regions 526 is an impurity element imparting the same conductivity type as the impurity element added in the previous step (i.e., the impurity element already contained in the impurity regions 526). In addition, the concentration of the impurity element added to the impurity regions 526 is higher than that of the impurity element in the previous step. By the addition of the impurity element, a pair of high-concentration impurity regions 530, a pair of low-concentration impurity regions 532, and a channel formation region 534 are formed in the semiconductor layer 520 (FIG. 14G). The high-concentration impurity regions 530 each function as a source or drain region.

Note that in the case where the semiconductor layer 520 is formed using a material containing silicon, a silicide region may be formed by forming silicide in part of the semiconductor layer 520 in order to further reduce the resistance of the source region and the drain region. The siliciding is performed in such a manner that metal is brought into contact with the semiconductor layer, and silicon in the semiconductor layer is made to react with the metal by heat treatment (e.g., a GRTA method or an LRTA method). For the silicide region, a cobalt silicide region or a nickel silicide region may be formed. In the case where the semiconductor layer 520 is thin, silicide reaction may proceed to a bottom of the semiconductor layer 520. Examples of a metal material used for forming silicide include titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), and palladium (Pd). Note that a silicide region can also be formed by laser light irradiation as the heat treatment.

Figure 14H:
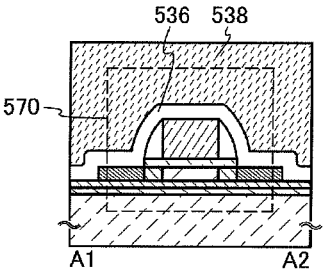

Next, an interlayer insulating layer 536 and an interlayer insulating layer 538 are formed so as to cover the components formed in the above steps (FIG. 14H). The interlayer insulating layer 536 and the interlayer insulating layer 538 can be formed using a material containing an inorganic insulating material such as silicon oxide, silicon oxynitride, silicon nitride oxide, silicon nitride, hafnium oxide, aluminum oxide, or tantalum oxide. Alternatively, an organic insulating material such as polyimide or acrylic can be used. Note that although a stacked structure of the interlayer insulating layer 536 and the interlayer insulating layer 538 is employed in this step, the present invention is not limited thereto. Either the interlayer insulating layer 536 or the interlayer insulating layer 538 is not necessarily formed, or a plurality of another layers may be further stacked. Note that after the interlayer insulating layer 538 is formed, a surface of the interlayer insulating layer 538 is preferably planarized by CMP, etching treatment, or the like. By the CMP or etching treatment, a surface of the gate electrode 524 is exposed.

Alternatively, an electrode electrically connected to the gate electrode 524 may be formed in such a manner that part of the interlayer insulating layer 536 and the interlayer insulating layer 538 are etched so that the gate electrode 524 is exposed and then a conductive film is formed in the opening.

As described above, the transistor 570 including the SOI substrate is formed (FIG. 14H). The transistor 570 can operate at high speed; therefore, a logic circuit (also referred to as an arithmetic circuit) or the like can be formed using the transistor. In other words, the transistor can be used for a driver circuit of a storage device or the like.

Note that an electrode, a wiring, an insulating layer, or the like may be formed as well after the above process. When the wirings has a multi-layer structure of a stacked structure including an interlayer insulating layer and a conductive layer, a highly integrated storage device can be provided.

Figure 15:
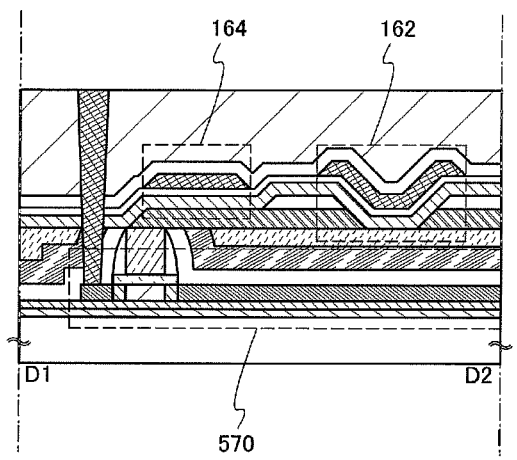
FIG. 15 illustrates a manufacturing method of a storage element according to an embodiment of the present invention.

With the SOI substrate provided with the transistor 570, a storage element can be formed as illustrated in FIG. 15 as well as FIGS. 6A and 6B or the like.

Next, electronic devices according to an embodiment of the present invention will be described. At least one of the storage devices described above is mounted on the electronic device according to an embodiment of the present invention. Examples of the electronic devices according to an embodiment of the present invention includes computers, mobile phones (also referred to as cellular phones or mobile phone sets), portable information terminals (including portable game consoles, audio reproducing devices, and the like), cameras such as digital cameras or digital video cameras, electronic paper, television sets (also referred to as televisions or television receivers), and the like.

Figure 16A:
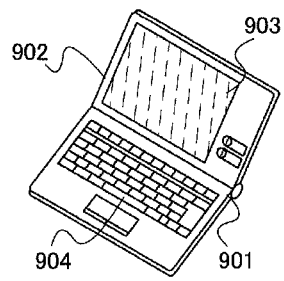
FIGS. 16A to 16F each illustrate an electronic device according to an embodiment of the present invention.

FIG. 16A illustrates a laptop personal computer including a housing 901, a housing 902, a display portion 903, a keyboard 904, and the like. The storage device described above is provided in the housing 901 and the housing 902. The storage device described above is mounted on the laptop personal computer illustrated in FIG. 16A, so that the power consumption and the area occupied by the storage device can be reduced.

Figure 16D:
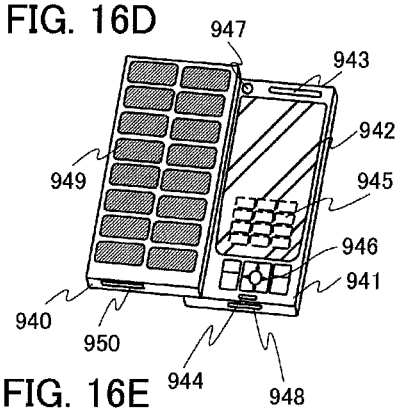
Figure 16B:
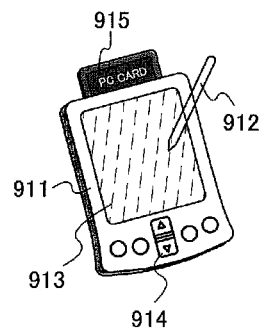

FIG. 16B illustrates a portable information terminal (personal digital assistance (PDA)). A main body 911 is provided with a display portion 913, an external interface 915, operation buttons 914, and the like. Further, a stylus 912 for operating the portable information terminal or the like is also provided. The storage device described above is provided in the main body 911. The storage device described above is mounted on the PDA illustrated in FIG. 16B, so that the power consumption and the area occupied by the storage device can be reduced.

Figure 16E:
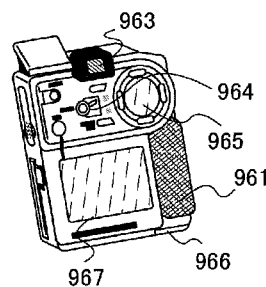
Figure 16C:
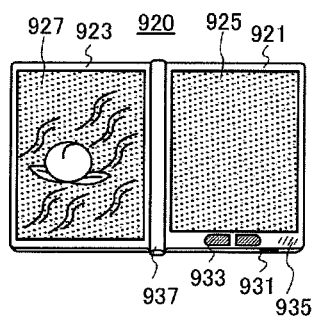

FIG. 16C illustrates an electronic book reader 920 mounting electronic paper. The electronic book reader 920 has two housings of a housing 921 and a housing 923. The housing 921 and the housing 923 are provided with a display portion 925 and a display portion 927, respectively. The housing 921 and the housing 923 are connected by a hinge 937 and can be opened and closed with the hinge 937 as an axis. Further, the housing 921 is provided with a power switch 931, operation keys 933, a speaker 935, and the like. At least one of the housing 921 and the housing 923 is provided with the storage device described above. The storage device described above is mounted on the electronic book reader illustrated in FIG. 16C, so that the power consumption and the area occupied by the storage device can be reduced.

FIG. 16D illustrates a mobile phone including two housings of a housing 940 and a housing 941. Further, the housing 940 and the housing 941 in a state where they are developed as illustrated in FIG. 16D can shift by sliding so that one is lapped over the other; therefore, the size of the mobile phone can be reduced, which makes the mobile phone suitable for being carried. The housing 941 is provided with a display panel 942, a speaker 943, a microphone 944, an operation key 945, a pointing device 946, a camera lens 947, an external connection terminal 948, and the like. The housing 940 is provided with a solar cell 949 that charges the mobile phone, an external memory slot 950, and the like. Note that an antenna is incorporated in the housing 941. At least one of the housing 940 and the housing 941 is provided with the storage device described above. The storage device described above is mounted on the mobile phone illustrated in FIG. 16D, so that the power consumption and the area occupied by the storage device can be reduced.

FIG. 16E illustrates a digital camera including a main body 961, a display portion 967, an eyepiece 963, an operation switch 964, a display portion 965, a battery 966, and the like. The storage device described above is provided in the main body 961. The storage device described above is mounted on the digital camera illustrated in FIG. 16E, so that the power consumption and the area occupied by the storage device can be reduced.

Figure 16F:
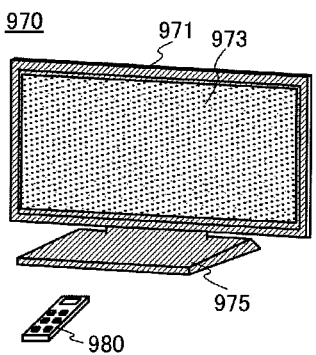

FIG. 16F illustrates a television set 970 including a housing 971, a display portion 973, a stand 975, and the like. The television set 970 can operate by a switch of the housing 971 or a remote controller 980. At least one of the housing 971 and the remote controller 980 is provided with the storage device described above. The storage device described above is mounted on the television set illustrated in FIG. 16F, so that the power consumption and the area occupied by the storage device can be reduced.

The present application is based on Japanese Patent Application serial No. 2010-010527 filed with the Japan Patent Office on Jan. 20, 2010, the entire contents of which are hereby incorporated by reference.

EXPLANATION OF REFERENCE

100: substrate, 102: protective layer, 104: semiconductor region, 106: element isolation insulating layer, 108a: gate insulating layer, 110: gate electrode, 112: insulating film, 114: impurity region, 116: channel formation region, 118: sidewall insulating layer, 120: high-concentration impurity region, 122: metal film, 124: metal compound region, 125: interlayer insulating layer, 126: interlayer insulating layer, 128: interlayer insulating layer, 141a: insulating layer, 141b: insulating layer, 142a: source or drain electrode, 142b: source or drain electrode, 143a: insulating layer, 143b: insulating layer, 144: oxide semiconductor layer, 146: gate insulating layer, 148a: gate electrode, 148b: electrode, 150: interlayer insulating layer, 151: opening, 152: interlayer insulating layer, 154: source or drain electrode, 160: transistor, 162: transistor, 164: capacitor, 500: base substrate, 502: nitrogen-containing layer, 510: single crystal semiconductor substrate, 512: oxide film, 514: embrittlement region, 516: single crystal semiconductor layer, 518: single crystal semiconductor layer, 520: semiconductor layer, 522: insulating layer, 522a: gate insulating layer, 524: gate electrode, 526: impurity region, 528: sidewall insulating layer, 530: high-concentration impurity region, 532: low-concentration impurity regions, 534: channel formation region, 536: interlayer insulating layer, 538: interlayer insulating layer, 570: transistor, 901: housing, 902: housing, 903: display portion, 904: keyboard, 911: main body, 912: stylus, 913: display portion, 914: operation buttons, 915: external interface, 920: electronic book reader, 921: housing, 923: housing, 925: display portion, 927: display portion, 931: power switch, 933: operation keys, 935: speaker, 937: hinge, 940: housing, 941: housing, 942: display panel, 943: speaker, 944: microphone, 945: operation key, 947: camera lens, 948: external connection terminal, 949: solar cell, 950: external memory slot, 961: main body, 963: eyepiece, 964: operation switch, 965: display portion, 966: battery, 967: display portion, 970: television set, 971: housing, 973: display portion, 975: stand, 980: remote controller, 1100: storage element, 1111: first driver circuit, 1112: second driver circuit, 1113: third driver circuit, 1114: fourth driver circuit.

The invention claimed is:

1. A semiconductor device comprising:
 a first transistor comprising:
  a first channel formation region including a first semiconductor material;
  impurity regions provided with the first channel formation region interposed therebetween;
  a first gate insulating layer provided over the first channel formation region;
  a first gate electrode overlapping with the first channel formation region and is provided over the first gate insulating layer; and
  a first source or drain electrode electrically connected to one of the impurity regions, and
 a second transistor comprising:
  a second source electrode;
  a second drain electrode;

a second channel formation region including a second semiconductor material and electrically connected to the second source electrode and the second drain electrode;

a second gate insulating layer provided over the second channel formation region; and a second gate electrode overlapping with the second channel formation region and provided over the second gate insulating layer, wherein the first semiconductor material comprises a single crystal semiconductor layer provided over an insulating surface, wherein the second semiconductor material is an oxide semiconductor, wherein the first transistor and the second transistor are provided so that at least part thereof overlap with each other, and wherein one of the second source electrode and the second drain electrode is electrically connected to the first gate electrode.

2. The semiconductor device according to claim 1, wherein the first semiconductor material and the second semiconductor material are different.

3. The semiconductor device according to claim 1 wherein a plurality of insulating layers is provided between the first transistor and the second transistor and at least an insulating layer of the plurality of insulating layers, which is in contact with the second transistor, is formed with a sputtering method.

4. The semiconductor device according to claim 1, wherein an energy gap of the second semiconductor material is higher than 3 eV.

5. The semiconductor device according to claim 1, wherein the first transistor is capable of operating at higher speed than the second transistor.

6. The semiconductor device according to claim 1, further comprising, sidewall insulating layers provided in contact with side surfaces of the first gate electrode.

7. The semiconductor device according to claim 1, wherein the first gate electrode is in direct contact with one of the second source electrode and the second drain electrode.

8. The semiconductor device according to claim 1, wherein an off-state current of the second transistor is lower than an off-state current of the first transistor.

9. The semiconductor device according to claim 8, wherein an off-state current of the second transistor at room temperature is less than or equal to 10 zA.

10. A semiconductor device comprising:
a first transistor comprising:
a first channel formation region including a first semiconductor material;
impurity regions provided with the first channel formation region interposed therebetween;
a first gate insulating layer provided over the first channel formation region;
a first gate electrode which overlapping with the first channel formation region and provided over the first gate insulating layer; and
a first source or drain electrode electrically connected to one of the impurity regions,
a second transistor comprising:
a second source electrode;
a second drain electrode;
a second channel formation region including a second semiconductor material and electrically connected to the second source electrode and the second drain electrode;

a second gate insulating layer provided over the second channel formation region; and a second gate electrode overlapping with the second channel formation region and provided over the second gate insulating layer, and a capacitor comprising:
one of the second source electrode and the second drain electrode;
the second gate insulating layer; and
an electrode for the capacitor provided over the second gate insulating layer, wherein the first semiconductor material comprises a single crystal semiconductor layer provided over an insulating surface, wherein the first transistor and the second transistor are provided so that at least part thereof overlap with each other, and wherein one of the second source electrode and the second drain electrode is electrically connected to the first gate electrode.

11. The semiconductor device according to claim 10, wherein the first semiconductor material and the second semiconductor material are different.

12. The semiconductor device according to claim 10, wherein an energy gap of the second semiconductor material is higher than 3 eV.

13. The semiconductor device according to claim 10, wherein the first transistor is capable of operating at higher speed than the second transistor.

14. The semiconductor device according to claim 10, wherein the capacitor further comprises a semiconductor layer including the second semiconductor material.

15. The semiconductor device according to claim 10, further comprising, sidewall insulating layers provided in contact with side surfaces of the first gate electrode.

16. The semiconductor device according to claim 10, wherein the first gate electrode is in direct contact with one of the second source electrode and the second drain electrode.

17. The semiconductor device according to claim 10, wherein the second semiconductor material is an oxide semiconductor.

18. The semiconductor device according to claim 17, wherein a plurality of insulating layers is provided between the first transistor and the second transistor and at least an insulating layer of the plurality of insulating layers, which is in contact with the second transistor, is formed with a sputtering method.

19. The semiconductor device according to claim 10, wherein an off-state current of the second transistor is lower than an off-state current of the first transistor.

20. The semiconductor device according to claim 19, wherein an off-state current of the second transistor at room temperature is less than or equal to 10 zA.

21. A semiconductor device comprising:
a first transistor comprising:
a first channel formation region including a first semiconductor material;
a first gate insulating layer;
a first gate electrode; and
a first source and drain electrode,
a second transistor comprising:
a second source electrode;
a second drain electrode;
a second channel formation region including a second semiconductor material;
a second gate insulating layer; and
a second gate electrode, an insulating layer provided over and in contact with the first transistor, and a capacitor comprising:
- one of the second source electrode and the second drain electrode;
- the second gate insulating layer; and
- an electrode for the capacitor provided over the second gate insulating layer, wherein the first semiconductor material comprises a single crystal semiconductor layer provided over an insulating surface, wherein the second transistor provided over the insulating layer, wherein the first gate electrode is exposed from a top surface of the insulating layer, and wherein one of the second source electrode and the second drain electrode is electrically connected to the first gate electrode.

22. The semiconductor device according to claim 21, wherein the first semiconductor material and the second semiconductor material are different.

23. The semiconductor device according to claim 21, wherein the second semiconductor material is an oxide semiconductor.

24. The semiconductor device according to claim 21, wherein the insulating layer comprises a plurality of insulating layers.

25. The semiconductor device according to claim 21, wherein an energy gap of the second semiconductor material is higher than 3 eV.

26. The semiconductor device according to claim 21, wherein the first transistor is capable of operating at higher speed than the second transistor.

27. The semiconductor device according to claim 21, wherein the capacitor further comprises a semiconductor layer including the second semiconductor material.

28. The semiconductor device according to claim 21, further comprising, sidewall insulating layers provided in contact with side surfaces of the first gate electrode.

29. The semiconductor device according to claim 21, wherein the first gate electrode is in direct contact with one of the second source electrode and the second drain electrode.

30. The semiconductor device according to claim 21, wherein an off-state current of the second transistor is lower than an off-state current of the first transistor.

31. The semiconductor device according to claim 30, wherein an off-state current of the second transistor at room temperature is less than or equal to 10 zA.

* * * * *